US009543318B1

(12) United States Patent
Lu et al.

(10) Patent No.: US 9,543,318 B1
(45) Date of Patent: Jan. 10, 2017

(54) THREE DIMENSIONAL MEMORY DEVICE WITH EPITAXIAL SEMICONDUCTOR PEDESTAL FOR PERIPHERAL TRANSISTORS

(71) Applicant: SANDISK TECHNOLOGIES INC., Plano, TX (US)

(72) Inventors: Zhenyu Lu, Milpitas, CA (US); Daxin Mao, Cupertino, CA (US); Koji Miyata, Yokkaichi (JP); Junichi Ariyoshi, Yokkaichi (JP); Johann Alsmeier, San Jose, CA (US); George Matamis, Danville, CA (US); Wenguang Shi, Milpitas, CA (US); Jiyin Xu, Yokkaichi (JP); Xiaolong Hu, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/832,579

(22) Filed: Aug. 21, 2015

(51) Int. Cl.
*H01L 27/115* (2006.01)
*H01L 21/28* (2006.01)
*H01L 29/423* (2006.01)
*H01L 29/792* (2006.01)
*H01L 29/66* (2006.01)

(52) U.S. Cl.
CPC ... *H01L 27/11582* (2013.01); *H01L 21/28282* (2013.01); *H01L 29/4234* (2013.01); *H01L 29/66833* (2013.01); *H01L 29/7926* (2013.01)

(58) Field of Classification Search
CPC .................. H01L 29/668332; H01L 29/66833; H01L 29/4234; H01L 29/7926; H01L 21/28282
See application file for complete search history.

(56) References Cited

U.S. PATENT DOCUMENTS

| 5,915,167 A | 6/1999 | Leedy |
| 7,005,350 B2 | 2/2006 | Walker et al. |
| 7,023,739 B2 | 4/2006 | Chen et al. |
| | (Continued) | |

FOREIGN PATENT DOCUMENTS

WO    WO02/15277 A2    2/2002

OTHER PUBLICATIONS

Notice of Allowance and Fee(s) Due and Notice of Allowability for U.S. Appl. No. 14/995,017, dated May 20, 2016, 14 pages.
(Continued)

*Primary Examiner* — Christine Enad
(74) *Attorney, Agent, or Firm* — The Marbury Law Group PLLC

(57) ABSTRACT

An alternating stack of insulator layers and spacer material layers is formed over a substrate. Stepped surfaces are formed in a contact region in which contact via structures are to be subsequently formed. An epitaxial semiconductor pedestal can be formed by a single epitaxial deposition process that is performed after formation of the stepped surfaces and prior to formation of memory openings, or a combination of a first epitaxial deposition process performed prior to formation of memory openings and a second epitaxial deposition process performed after formation of the memory openings. The epitaxial semiconductor pedestal can have a top surface that is located above a topmost surface of the alternating stack. The spacer material layers are formed as, or can be replaced with, electrically conductive layers. Backside contact via structures can be subsequently formed.

18 Claims, 16 Drawing Sheets

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,394,716 | B2 | 3/2013 | Hwang et al. |
| 9,305,934 | B1 * | 4/2016 | Ding ................ H01L 27/11573 |
| 9,412,749 | B1 | 8/2016 | Shimabukuro et al. |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0032250 | A1 | 2/2012 | Son et al. |
| 2012/0119287 | A1 | 5/2012 | Park et al. |
| 2013/0264631 | A1 | 10/2013 | Alsmeier et al. |
| 2014/0061849 | A1 * | 3/2014 | Tanzawa ............ H01L 27/11531 257/499 |
| 2014/0199815 | A1 * | 7/2014 | Hwang ............. H01L 29/66833 438/270 |
| 2015/0236038 | A1 | 8/2015 | Pachamuthu et al. |
| 2016/0049421 | A1 | 2/2016 | Zhang et al. |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/517,134, filed Oct. 17, 2014, SanDisk Technologies Inc.

Invitation to Pay Additional Fees and Communication Relating to the Results of Partial International Search from the International Searching Authority for International Application No. PCT/US2016/036656, dated Sep. 16, 2016, 7 pages.

The International Search Report and the Written Opinion of the International Searching Authority for International Application No. PCT/US2016/036656, dated Nov. 10, 2016, 17 pages.

* cited by examiner

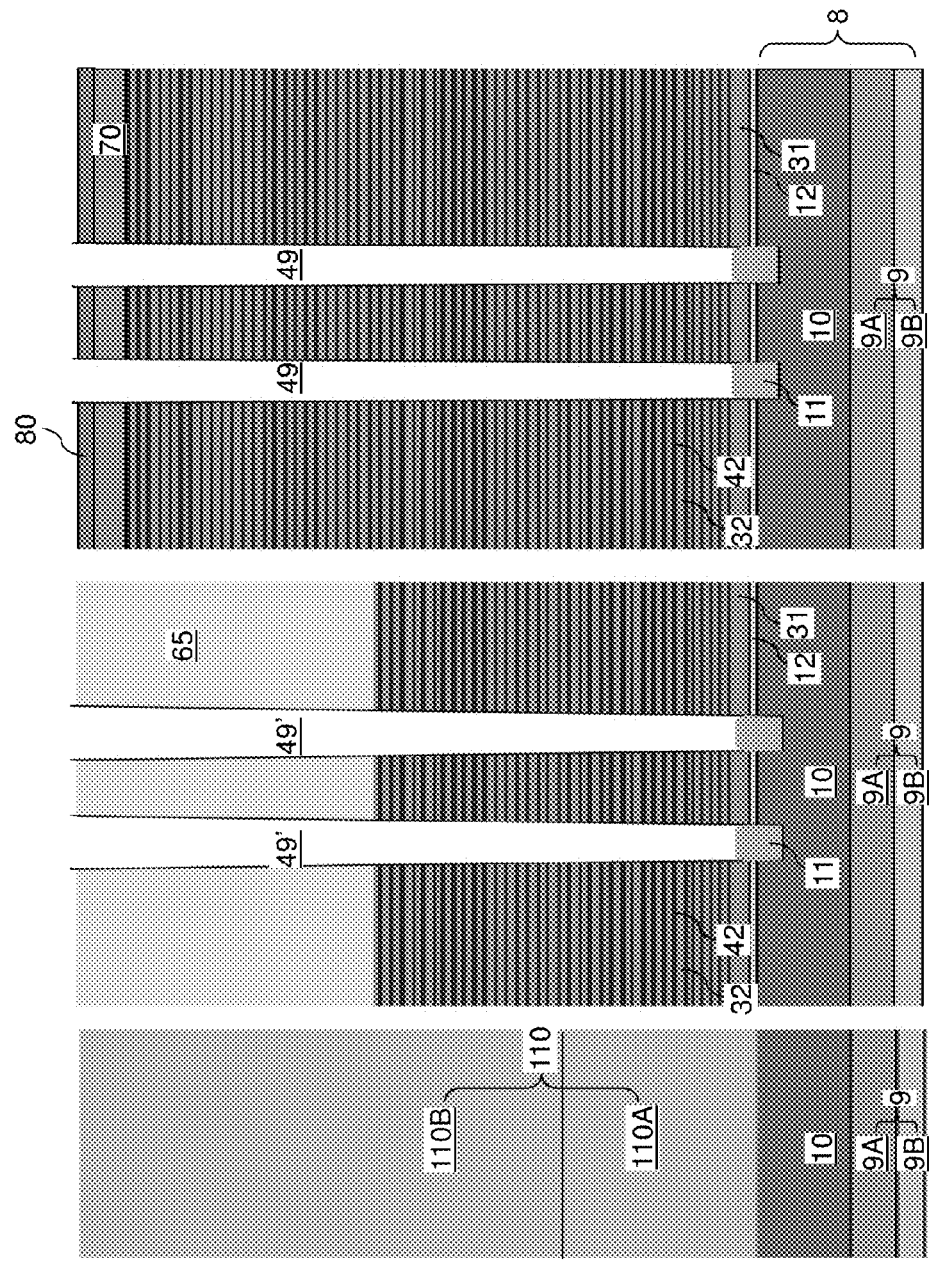

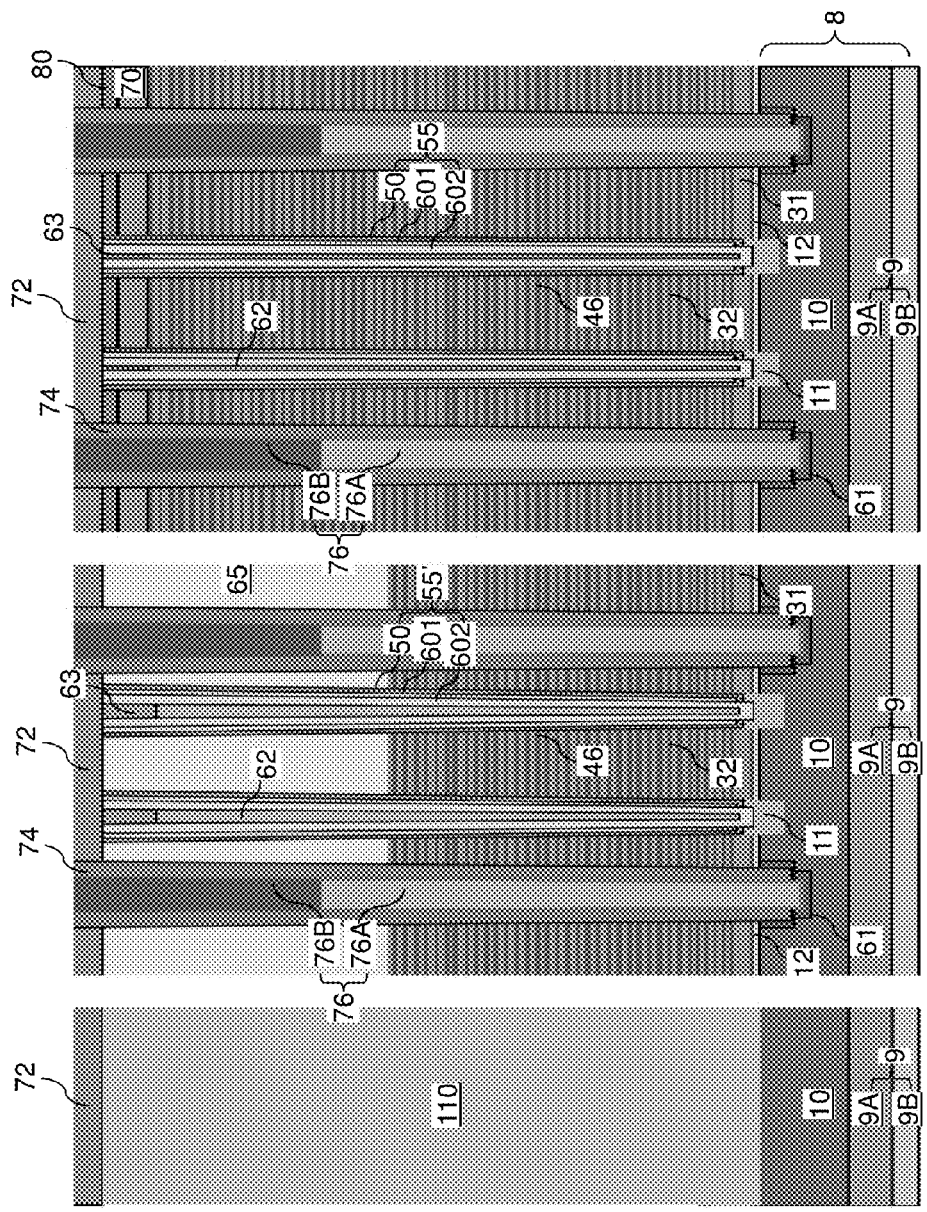

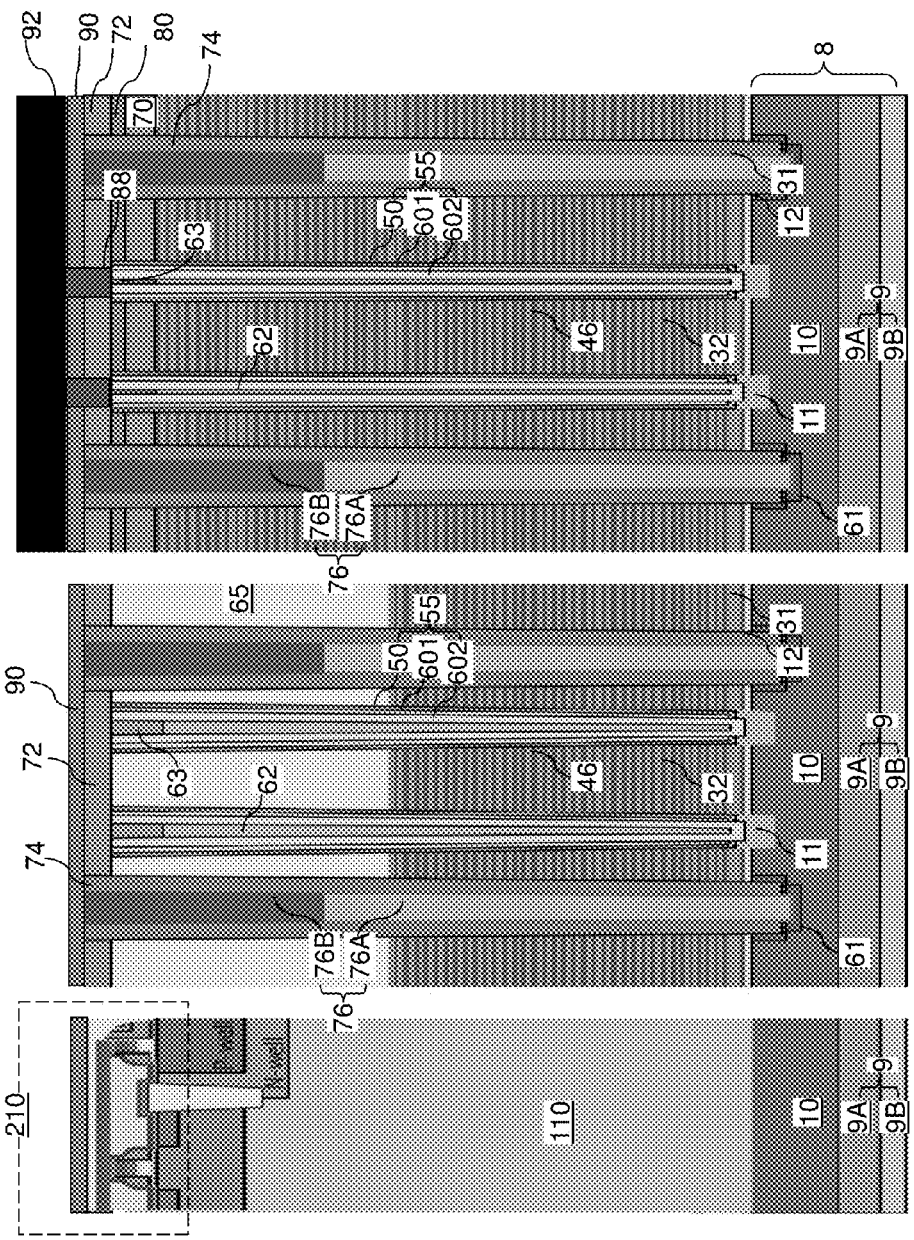

US 9,543,318 B1

THREE DIMENSIONAL MEMORY DEVICE WITH EPITAXIAL SEMICONDUCTOR PEDESTAL FOR PERIPHERAL TRANSISTORS

FIELD

The present disclosure relates generally to the field of three-dimensional semiconductor devices, and specifically to three-dimensional memory devices including peripheral devices and methods of manufacturing the same.

BACKGROUND

Peripheral devices are needed to control operation of various memory elements in three-dimensional memory devices. As the number of stacks in three-dimensional memory devices increases, the height of contact via structures for providing electrical contact to peripheral devices increases. Such an increase in the height of contact via structures makes it difficult to form reliable contact via structures for the peripheral devices.

SUMMARY

According to an aspect of the present disclosure, a method of fabricating a memory device comprises forming an alternating stack of insulator layers and spacer material layers over a single crystalline semiconductor surface of a substrate and forming stepped surfaces by patterning the alternating stack. The single crystalline semiconductor surface is exposed in a region from which all layers of the alternating stack are removed. The method further comprises after forming the stepped surfaces, forming an epitaxial semiconductor pedestal and a dielectric material portion over a semiconductor surface of the semiconductor substrate and over the stepped surfaces, respectively. The epitaxial semiconductor pedestal is in epitaxial alignment with the single crystalline semiconductor surface of the substrate. The method further comprises forming an array of memory stack structures through a remaining portion of the alternating stack, and forming at least one semiconductor device on the epitaxial semiconductor pedestal.

According to another aspect of the present disclosure, a memory device comprises an alternating stack of electrically conductive layers and insulator layers located over a semiconductor substrate, an array of memory stack structures located within memory openings which extend through the alternating stack, a dielectric material portion overlying stepped surfaces of the alternating stack, an epitaxial semiconductor pedestal having substantially vertical sidewalls in epitaxial alignment with a single crystalline substrate semiconductor material in the semiconductor substrate, and at least one semiconductor device located on the top surface of the epitaxial semiconductor pedestal.

BRIEF DESCRIPTION OF THE DRAWINGS

FIG. 10B is a vertical cross-sectional view of the exemplary structure of FIG. 10A along the vertical plane B-B'.

FIG. 10C is a vertical cross-sectional view of the exemplary structure of FIG. 10A along the vertical plane C-C'.

FIG. 10D is a vertical cross-sectional view of the exemplary structure of FIG. 10A along the vertical plane B-B'.

FIG. 11B is a vertical cross-sectional view of the exemplary structure of FIG. 11A along the vertical plane B-B'.

FIG. 11C is a vertical cross-sectional view of the exemplary structure of FIG. 11A along the vertical plane C-C'.

FIG. 11D is a vertical cross-sectional view of the exemplary structure of FIG. 11A along the vertical plane B-B'.

FIG. 12B is a vertical cross-sectional view of the exemplary structure of FIG. 12A along the vertical plane B-B'.

FIG. 12C is a vertical cross-sectional view of the exemplary structure of FIG. 12A along the vertical plane C-C'.

FIG. 12D is a vertical cross-sectional view of the exemplary structure of FIG. 12A along the vertical plane D-D'.

DETAILED DESCRIPTION

As discussed above, the present disclosure is directed to three-dimensional memory devices incorporating peripheral transistors, and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figure 1:
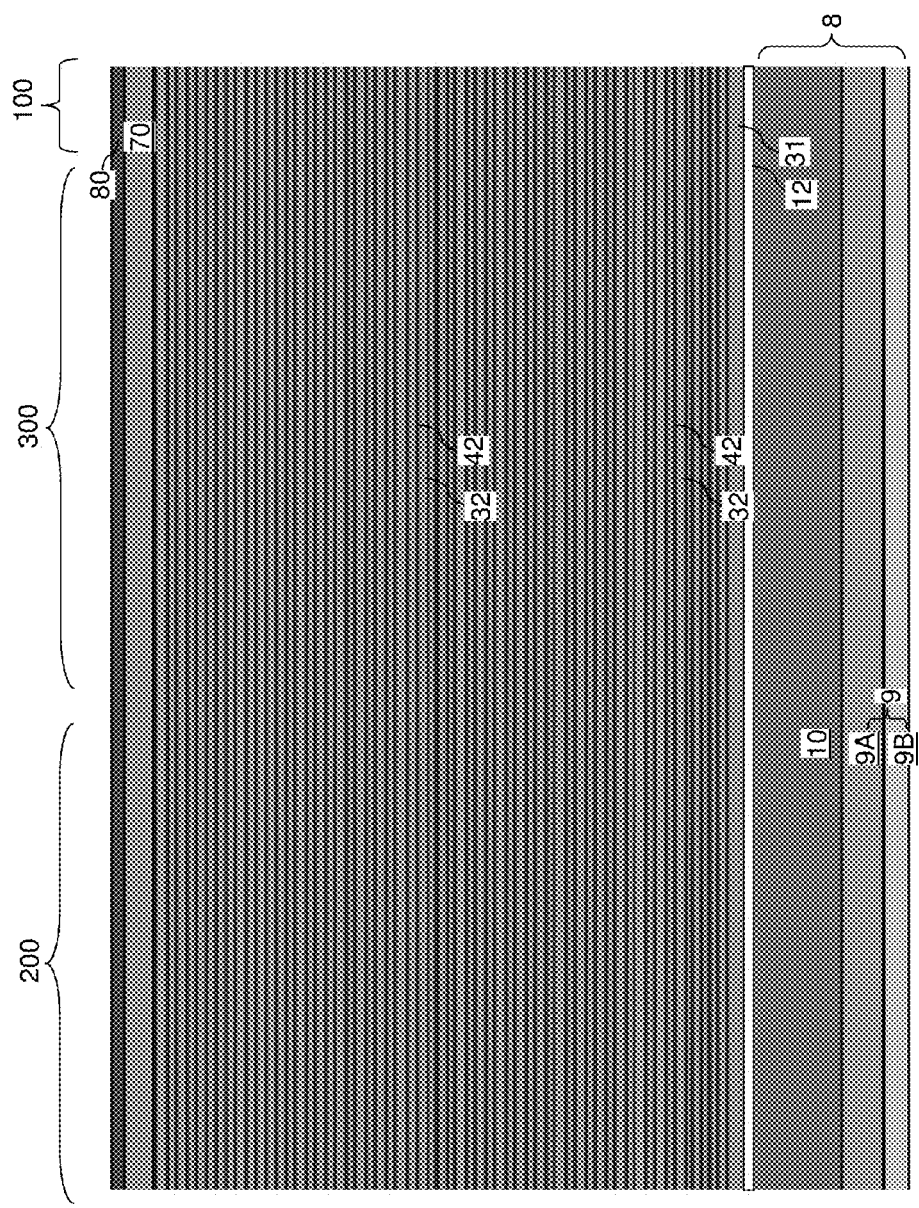
FIG. 1 is a vertical cross-sectional view of a first exemplary structure of after formation of a stack of alternating layers, an insulating cap layer, and a planarization stopping layer over a substrate according to a embodiments of the present disclosure.

Referring to FIG. 1, a first exemplary structure according to an embodiment of the present disclosure is illustrated, which can be employed, for example, to fabricate a device structure containing vertical NAND memory devices. The exemplary structure includes a substrate 8, which can be a semiconductor substrate, such as a single crystal silicon wafer. The semiconductor substrate 8 can include one or more material layers (9, 10). In one embodiment, the substrate 8 can include at least one underlying material layer 9 and a single crystalline semiconductor layer 10 as a topmost layer. In one embodiment, the at least one underlying material layer 9 can include a semiconductor material layer having a doping of a different conductivity type than the single crystalline semiconductor layer 10 located thereabove. Alternatively or additionally, the at least one underlying material layer 9 can include a buried insulator layer. In one embodiment, the at least one underlying material layer 9 can include a first semiconductor material layer 9B having a doping of a first conductivity type, and a second semiconductor material layer 9A having a doping of a second conductivity type that is the opposite of the first conductivity type. The single crystalline semiconductor material layer 10 can have a doping of the first conductivity type.

The single crystalline semiconductor layer 10 is a semiconductor material layer, and can include at least one elemental semiconductor material (e.g., silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the single crystalline semiconductor layer 10.

Optionally, a dielectric pad layer 12 can be formed on a top surface of the single crystalline semiconductor layer 10. The dielectric pad layer 12 can be, for example, silicon oxide layer. The thickness of the dielectric pad layer 12 can be in a range from 3 nm to 30 nm, although lesser and greater thicknesses can also be employed. Optionally, a bottom insulator layer 31 can be formed over the dielectric pad layer 12. If present, the bottom insulator layer 31 includes a dielectric material, and can be formed directly on top surfaces of the dielectric pad layer 12. Exemplary materials that can be employed for the bottom insulator layer 31 include, but are not limited to, silicon oxide, a dielectric metal oxide, and silicon nitride (in case the material of second material layers to be subsequently formed is not silicon nitride).

An alternating stack of first material layers (which can be insulating layers 32) and second material layers (which can be spacer material layer 42) is formed over the top surface of the substrate 8, which can be, for example, on the top surface of the bottom insulator layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a spacer material layer 42 that provides vertical separation between the insulator layers. In this case, the stack can include an alternating plurality of insulator layers 32 and spacer material layers 42.

The stack of the alternating plurality is herein referred to as an alternating stack (32, 42). In one embodiment, the alternating stack (32, 42) can include insulator layers 32 composed of the first material, and spacer material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the spacer material layers 42 is a sacrificial material that can be removed selective to the first material of the insulator layers 32. In this case, the spacer material layers 42 are referred to sacrificial material layers. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The spacer material layers 42 may comprise an electrically insulating material, a semiconductor material, or a conductive material. In case the spacer material layers 42 are sacrificial material layers, the sacrificial material of the spacer material layers 42 can be subsequently replaced with electrically conductive electrodes, which can function, for example, as control gate electrodes of a vertical NAND device. Non-limiting examples of the sacrificial material that can be employed for the spacer material layers 42 include silicon nitride, an amorphous semiconductor material (such as amorphous silicon), and a polycrystalline semiconductor material (such as polysilicon). In one embodiment, the spacer material layers 42 can be sacrificial material layers that comprise silicon nitride or a semiconductor material including at least one of silicon and germanium. Alternatively, the spacer material layers 42 can be conductive material layers that are not subsequently replaced, i.e., permanent conductive material layers.

In one embodiment, the insulator layers 32 can include silicon oxide, and spacer material layers can include silicon nitride spacer material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the spacer material layers 42 can be formed, for example, CVD or atomic layer deposition (ALD).

The thicknesses of the insulator layers 32 and the spacer material layers 42 can be in a range from 20 nm to 50 nm, although lesser and greater thicknesses can be employed for each insulator layer 32 and for each spacer material layer 42. The number of repetitions of the pairs of an insulator layer 32 and a spacer material layer (e.g., a control gate electrode or a spacer material layer) 42 can be in a range from 2 to 1,024, and typically from 8 to 256, although a greater number of repetitions can also be employed. The top and bottom gate electrodes in the stack may function as the select gate electrodes. In one embodiment, each spacer material layer 42 in the alternating stack (32, 42) can have a uniform thickness that is substantially invariant within each respective spacer material layer 42.

An insulating cap layer 70 can be deposited over the alternating stack (32, 42). The insulating cap layer 70 includes an insulator material, which may be the same material as the first material of the insulator layers 32. The insulating cap layer 70 includes a material that is different from the second material of the spacer material layers 42. The thickness of the insulating cap layer 70 can be in a range from 20 nm to 100 nm, although lesser and greater thicknesses can also be employed.

A planarization stopping layer 80 can be formed over the insulating cap layer 70. The planarization stopping layer 80 includes a dielectric material that can be employed as a stopping layer in a subsequent planarization step, which may employ chemical mechanical planarization. For example, the planarization stopping layer 80 can employ a dielectric metal oxide (such as aluminum oxide), silicon nitride, or silicon oxide. The planarization stopping layer 80 includes a dielectric material that is different from the second material of the spacer material layers 42. The thickness of the planarization stopping layer 80 can be in a range from 5 nm to 40 nm, although lesser and greater thicknesses can also be employed.

The first exemplary structure can have a region in which memory devices are to be subsequently formed, which is herein referred to as a device region 100. The first exemplary structure can have another region in which contact via structures that contact control gate electrodes are subsequently formed, which is herein referred to as contact region 300. The first exemplary structure can have still another region in which peripheral devices that control the operation of the memory devices are to be subsequently formed, which is herein referred to as a peripheral device region 200.

Figure 2:
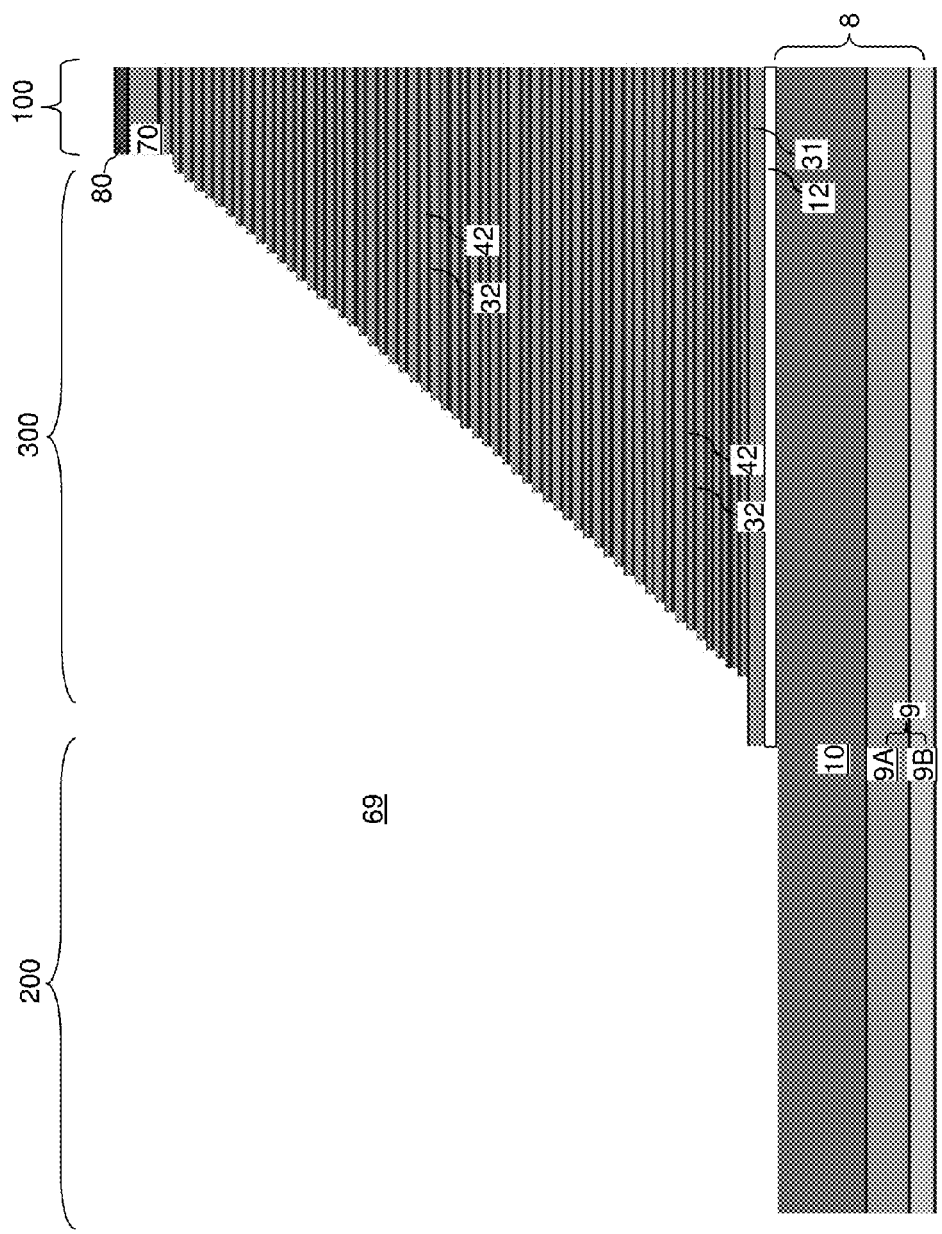
FIG. 2 is a vertical cross-sectional view of the first exemplary structure after formation of stepped terraces according to a first embodiment of the present disclosure.

Referring to FIG. 2, a stepped cavity 69 extending over the contact region 300 and the peripheral device region 200 can be formed according to a first embodiment. The stepped cavity 69 can have various stepped surfaces such that the horizontal cross-sectional shape of the stepped cavity changes in steps as a function of the vertical distance from the top surface of the substrate 8. In one embodiment, the stepped cavity 69 can be formed by initially masking the device region 100 and optionally the contact region 200 with a masking layer (which may be a patterned photoresist layer), patterning the planarization stopping layer 80 and the insulating cap layer 70 by etching unmasked portions of the same, and by repetitively performing a set of processing steps to form the stepped surfaces. In alternative embodiments, regions 200 and 300 may etched at the same time during the same etch step, or region 200 may be etched prior to region 300 in separate etch steps.

The set of processing steps can include, for example, an etch process of a first type that vertically increases the depth of a cavity by one or more levels, and an etch process of a second type that laterally expands the area to be vertically etched in a subsequent etch process of the first type by trimming the masking layer (for example, by partially ashing an outer portion of the masking layer). As used herein, a "level" of a structure including alternating plurality is defined as the relative position of a pair of a first material layer and a second material layer within the structure. For example, a photoresist layer (not shown) can be applied and patterned to initially cover the device region 100 and the contact region 300, and an anisotropic etch process and an ashing process can be alternately performed. Each anisotropic etch process can vertically extend a pre-existing cavity by two vertical levels (corresponding to a pair of an insulator layer 32 and a spacer material layer 42) and etch through the planarization stopping layer 80 and the insulating cap layer 70 within a newly physically exposed area, which is the area in which the top surface of the planarization stopping layer 80 is physically exposed during an immediately preceding ashing process that trims an outer portions of the photoresist layer. Each ashing process trims the photoresist layer by removing only the outermost portions of the photoresist layer. The duration of the ashing process determines the amount of the ashed photoresist material, and the length of the corresponding ledge, i.e., a horizontal surface, of the stepped surfaces. The portions of layers 32 and 42 of the alternating stack (32, 42) as well as layers 12 and 31 located in region 200 may be removed during the formation of the stepped surfaces to expose the semiconductor substrate 8 (e.g., single crystal silicon substrate semiconductor layer 10) in region 200. Alternatively, the portions of these layers located in region 200 may be removed during a separate etching step from the steps using to form the stepped surfaces.

A peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces. Remaining portions of the mask layer can be removed, for example, by ashing.

Figure 3:
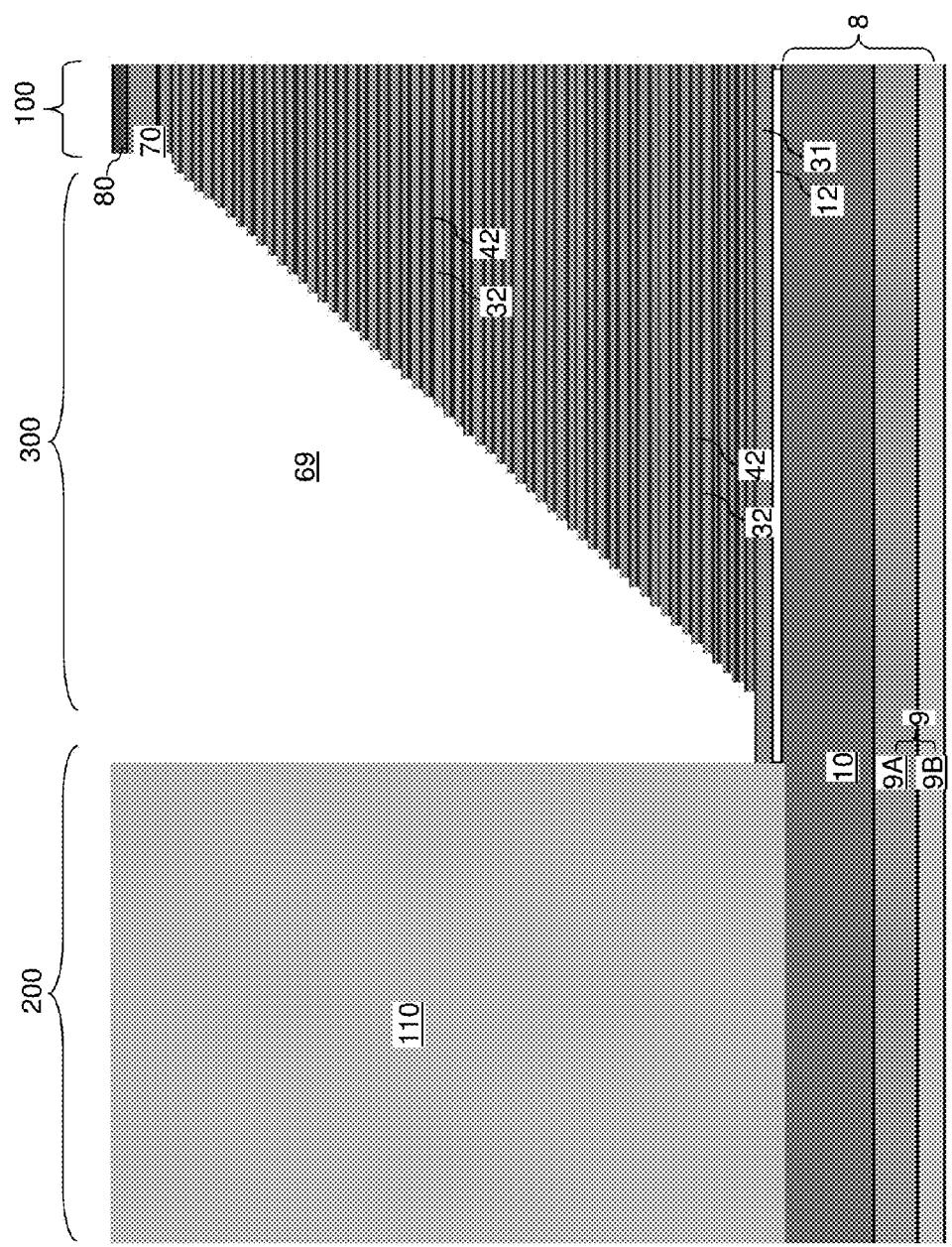
FIG. 3 is a vertical cross-sectional view of the first exemplary structure after formation of an epitaxial semiconductor pedestal in a peripheral device region according to the first embodiment of the present disclosure.

Referring to FIG. 3, an epitaxial semiconductor pedestal 110 can be formed in the peripheral device region 200, which is the region in which a top surface of the single crystalline substrate semiconductor material of the semiconductor material layer 10 is physically exposed. The epitaxial semiconductor pedestal 110 can be formed by a selective epitaxy process. The epitaxial semiconductor pedestal 110 comprises a single crystalline semiconductor material (e.g., single crystal silicon) in epitaxial alignment with the single crystalline substrate semiconductor material (e.g., single crystal silicon) of the semiconductor material layer 10. Optionally, the epitaxial semiconductor pedestal 110 can be doped with electrical dopants of a suitable conductivity type. The top surface of the epitaxial semiconductor pedestal 110 can be coplanar with, or can be located above, the horizontal plane including the top surface of the planarization stopping layer 80. The sidewall surfaces of the epitaxial semiconductor pedestal 110 may be substantially vertical and have no stepped surfaces which are a mirror image of the stepped surfaces in the stack in region 300. The angle of the substantially vertical sidewalls of the epitaxial semiconductor pedestal 110 with respect to a horizontal plane (e.g., the top surface of the substrate) can be in a range from 80 degrees to 100 degrees, such as 90 degrees.

The selective epitaxy process that forms the epitaxial semiconductor pedestal can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the semiconductor material layer 10) is greater than the etch rate of the semiconductor material by the etchant. Thus, the semiconductor material is deposited only on the semiconductor surface, which is the physically exposed portion of the top surface of the semiconductor material layer 10. The process conditions (such as the deposition temperature, the partial pressure of the various gases in a process chamber, etc.) can be selected such that the deposited semiconductor material is epitaxial, i.e., single crystalline with atomic alignment with the single crystalline structure of the semiconductor material layer 10.

Figure 4:
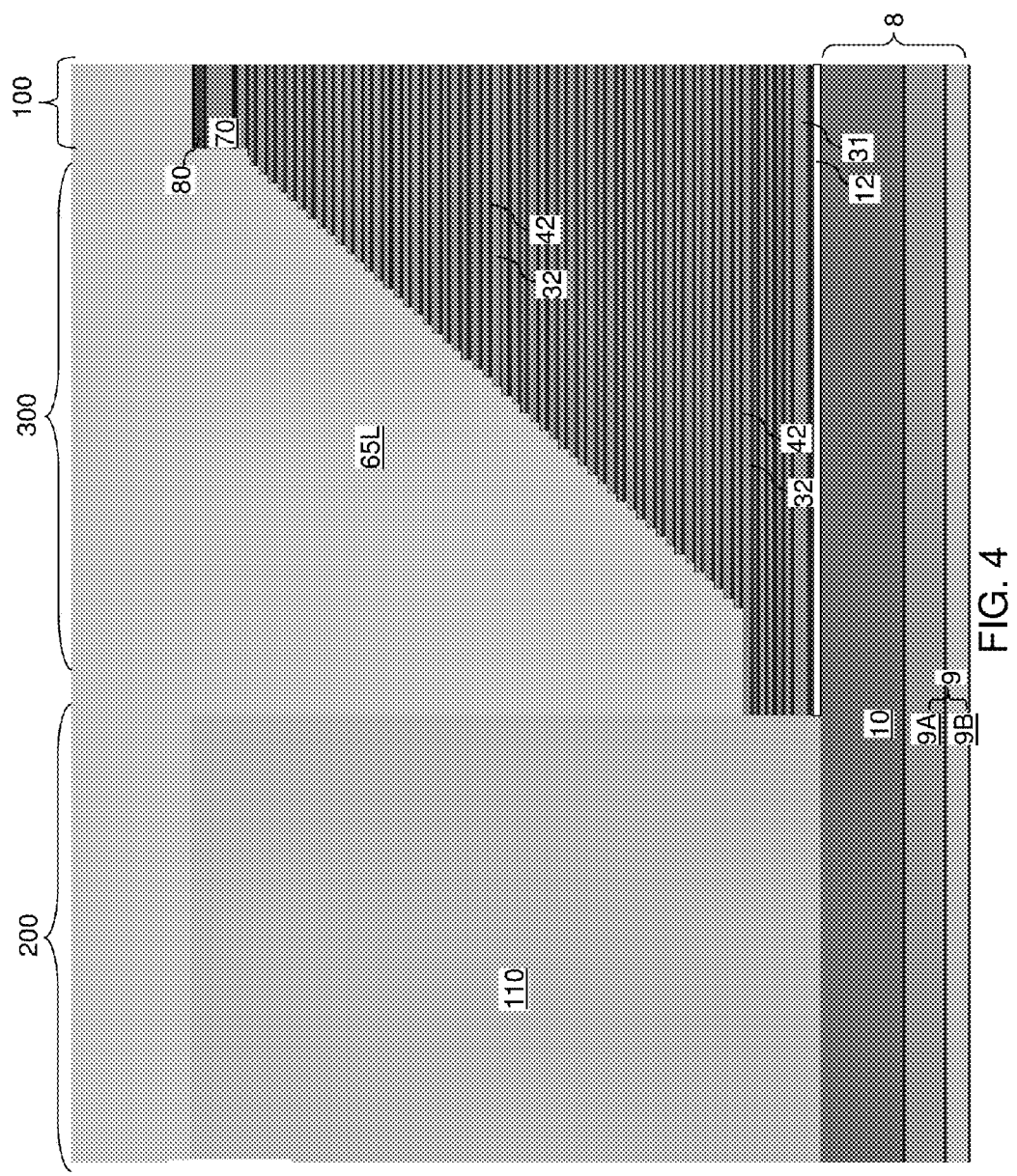
FIG. 4 is a vertical cross-sectional view of the first exemplary structure after deposition of a dielectric fill material layer according to the first embodiment of the present disclosure.

Referring to FIG. 4, a dielectric fill material layer 65L is deposited in the remaining portion of the stepped cavity 69, which is present in the contact region 300, and over the alternating stack (32, 42) in the device region 100, and over the epitaxial semiconductor pedestal 110 in the peripheral device region 200. The dielectric fill material layer 65L includes a dielectric material that can be subsequently planarized employing a planarization process such as chemical mechanical planarization (CMP). For example, the dielectric fill material layer 65L can include a dielectric material such as undoped silicon oxide or doped silicon oxide (such as phosphosilicate glass, borosilicate glass, or borophosphosilicate glass). The dielectric fill material layer 65L can completely fill the remaining portion of the stepped cavity 69 in the contact region 300.

Figure 5:
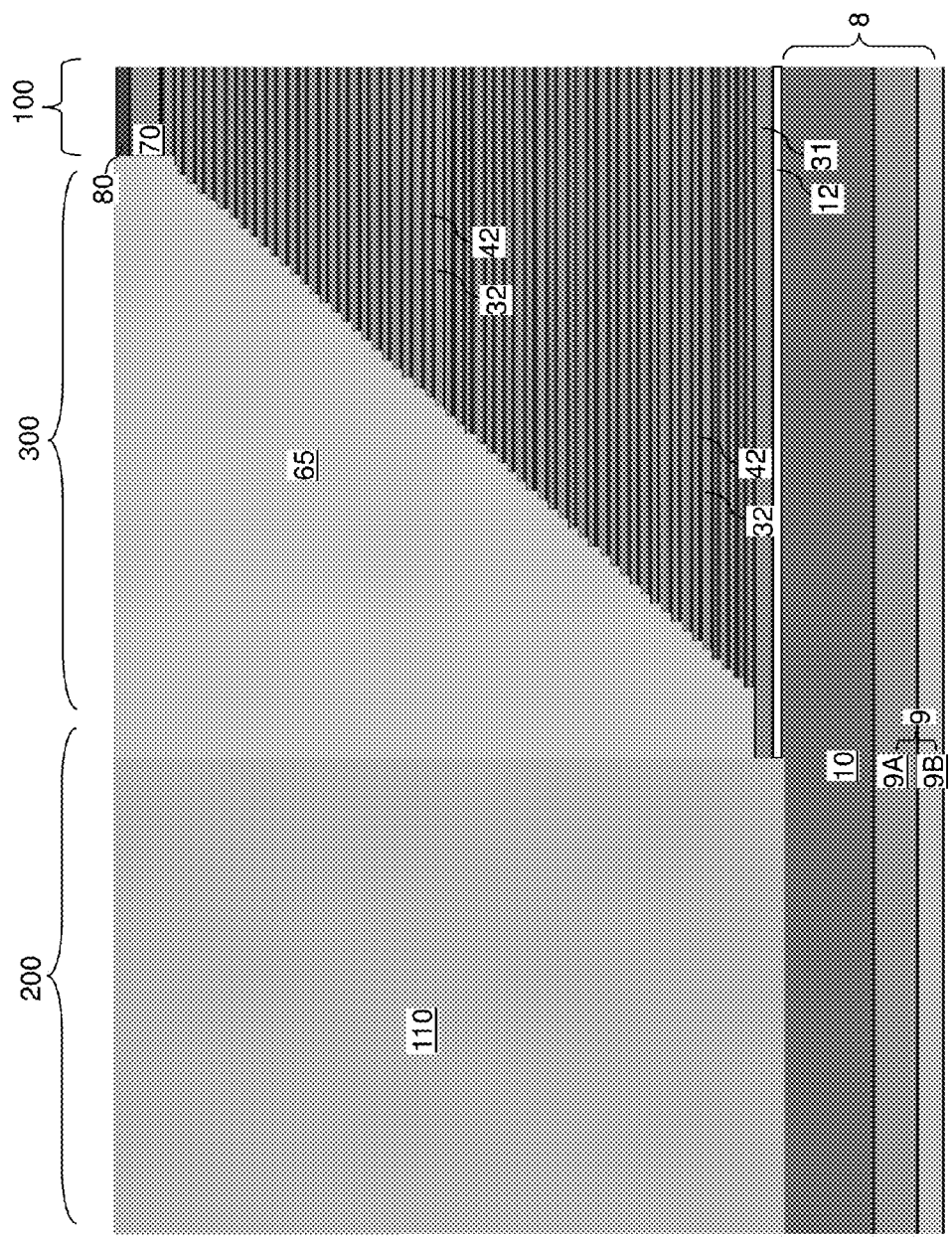
FIG. 5 is a vertical cross-sectional view of the first exemplary structure after formation of a dielectric material portion according to the first embodiment of the present disclosure.

Referring to FIG. 5, a planarization process can be performed to remove portions of the dielectric fill material layer 65L from above a horizontal plane including the top surface of the planarization stopping layer 80. For example, portions of the dielectric fill material layer 65L can be removed from above the top surface of the planarization stopping layer 80, for example, by chemical mechanical planarization (CMP). The remaining portion of the dielectric fill material layer 65L filling the stepped cavity in the contact region 300 constitutes a dielectric material portion (i.e., an insulating fill material portion). In one embodiment, the dielectric material portion can include retro-stepped bottom surfaces. In this case, the dielectric material portion is herein referred to as a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. Thus, an epitaxial semiconductor pedestal 110 and a retro-stepped dielectric material portion 65 are formed over a semiconductor surface of the semiconductor substrate 8 and over the stepped surfaces, respectively. If desired, the retro-stepped dielectric material portion 65 may also be formed over a part of the exposed substrate 8. The epitaxial semiconductor pedestal 110 is in epitaxial alignment with a single crystalline substrate semiconductor material in the semiconductor substrate 8.

In one embodiment, the dielectric material of the dielectric fill material layer 65L can be planarized to form the retro-stepped dielectric material portion 65 employing at least the epitaxial semiconductor pedestal 110 as a stopping structure for the planarization process. In one embodiment, the dielectric material of the dielectric fill material layer 65L can be planarized to form the retro-stepped dielectric material portion 65 employing the epitaxial semiconductor pedestal 110 and the planarization stopping layer 80 as stopping structures for the planarization process. The use of pedestal 100 as a planarization (e.g., polish) stop during planarization (e.g., CMP) of the retro-stepped dielectric material portion 65 is one non-limiting advantage of forming the pedestal 110 after forming the stepped surfaces in region 300. Another non-limiting advantage of forming the pedestal 110 after forming the stepped surfaces in region 300 is that no stepped surfaces are formed in the sidewall(s) of the pedestal 110. This leaves more room at the flat top surface of the pedestal 110 to form peripheral (e.g., driver circuit) devices and/or a reduction of space used for the pedestal which permits more memory devices to be formed in region 100 for the same size substrate.

Figure 6:
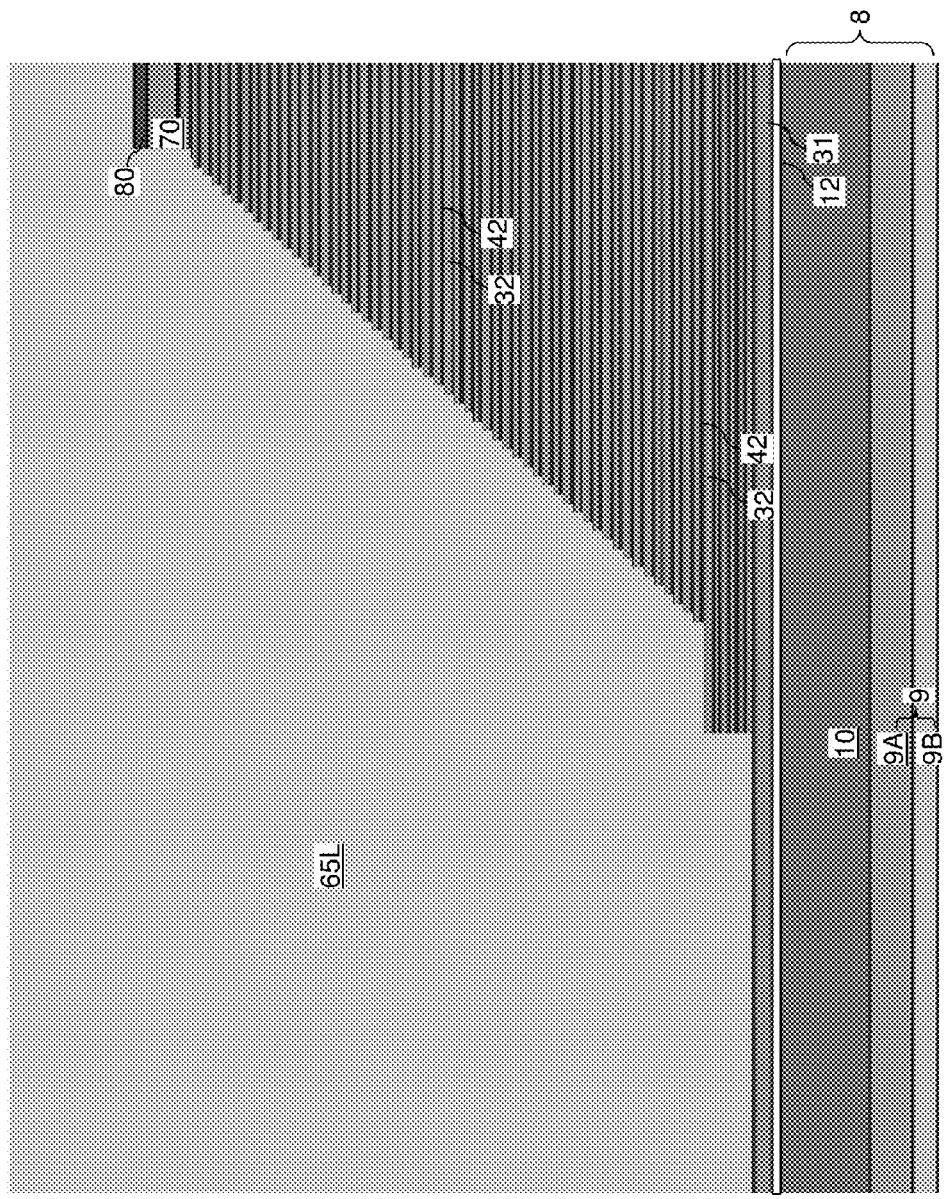
FIG. 6 is a vertical cross-sectional view of a second exemplary structure after formation of a dielectric fill material layer according to a second embodiment of the present disclosure.

Referring to FIG. 6, a second exemplary structure according to a second embodiment of the present disclosure can be derived from the first exemplary structure of FIG. 2 by forming a dielectric fill material layer 65L prior to forming the epitaxial semiconductor pedestal. The planarization stopping layer 80 is patterned prior to forming the stepped surfaces illustrated in FIG. 2. The dielectric fill material layer 65L of FIG. 6 can have the same composition as the dielectric fill material layer 65L of FIG. 4. Further, the dielectric fill material layer 65L of FIG. 6 can be formed employing the same deposition methods as the deposition methods for forming the dielectric fill material layer 65L of FIG. 4.

Figure 7:
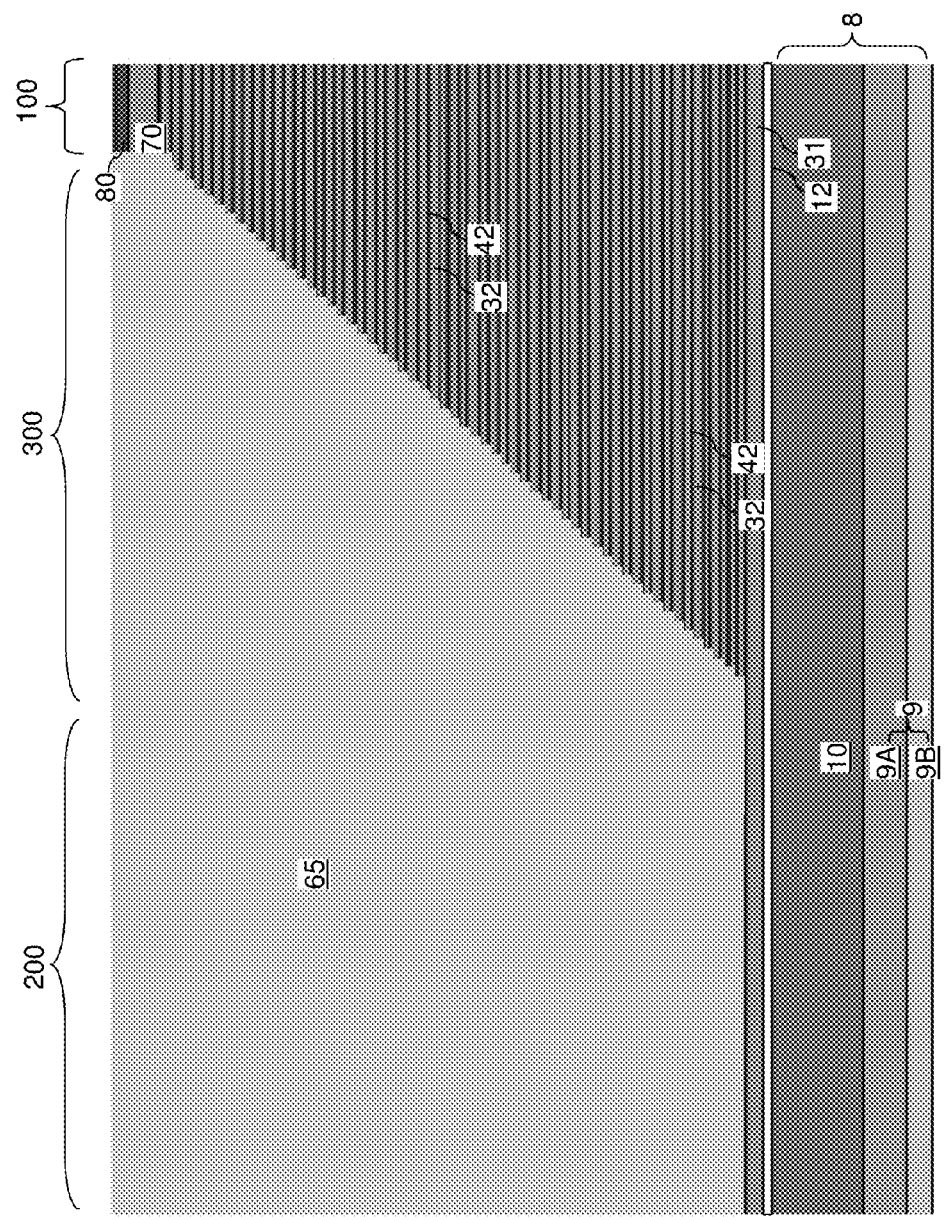
FIG. 7 is a vertical cross-sectional view of the second exemplary structure after formation of a dielectric material portion according to the second embodiment of the present disclosure.

Referring to FIG. 7, a planarization process can be performed to remove portions of the dielectric fill material layer 65L from above a horizontal plane including the top surface of the planarization stopping layer 80. For example, portions of the dielectric fill material layer 65L can be removed from above the top surface of the planarization stopping layer 80, for example, by chemical mechanical planarization (CMP). The dielectric fill material layer 65L can be planarized employing the planarization topping layer 80 as a stopping layer. The remaining portion of the dielectric fill material layer 65L filling the stepped cavity in the contact region 300 and the peripheral device region 200 constitutes a retro-stepped dielectric material portion 65 (i.e., an insulating fill material portion). If silicon oxide is employed for the retro-stepped dielectric material portion 65, the silicon oxide of the retro-stepped dielectric material portion 65 may, or may not, be doped with dopants such as B, P, and/or F.

Figure 8:
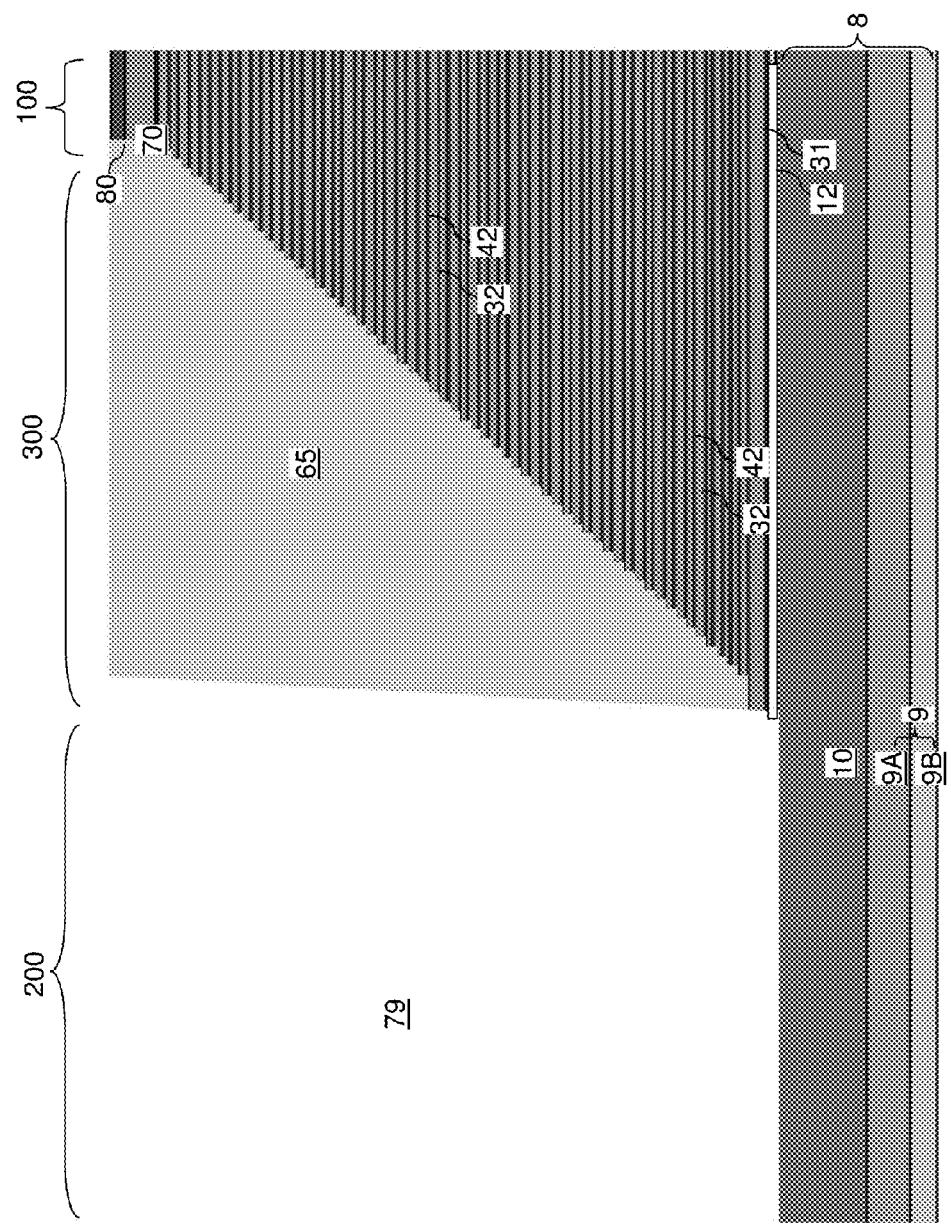
FIG. 8 is a vertical cross-sectional view of the second exemplary structure after removal of a region of the dielectric material portion according to the second embodiment of the present disclosure.

Referring to FIG. 8, a photoresist layer (not shown) can be applied over the planarization stopping layer 80 and the retro-stepped dielectric material portion 65, and can be patterned to cover the device region 100 and the contact region 300, while not covering the peripheral device region 200. An anisotropic etch or an isotropic etch can be performed to remove a portion of the retro-stepped dielectric material portion 65 from the peripheral device region 200. In one embodiment, an anisotropic etch can be employed to remove the physically exposed region of the retro-stepped dielectric material portion 65 from above the top surface of the semiconductor substrate 8 in the peripheral device region 200. Thus, the retro-stepped dielectric material portion 65 as provided after the processing steps of FIG. 8 is formed by deposition and patterning of a dielectric material. Specifically, a remaining portion of the deposited dielectric material over the stepped surfaces in the contact region 300 constitutes the retro-stepped dielectric material portion 65.

Figure 9:
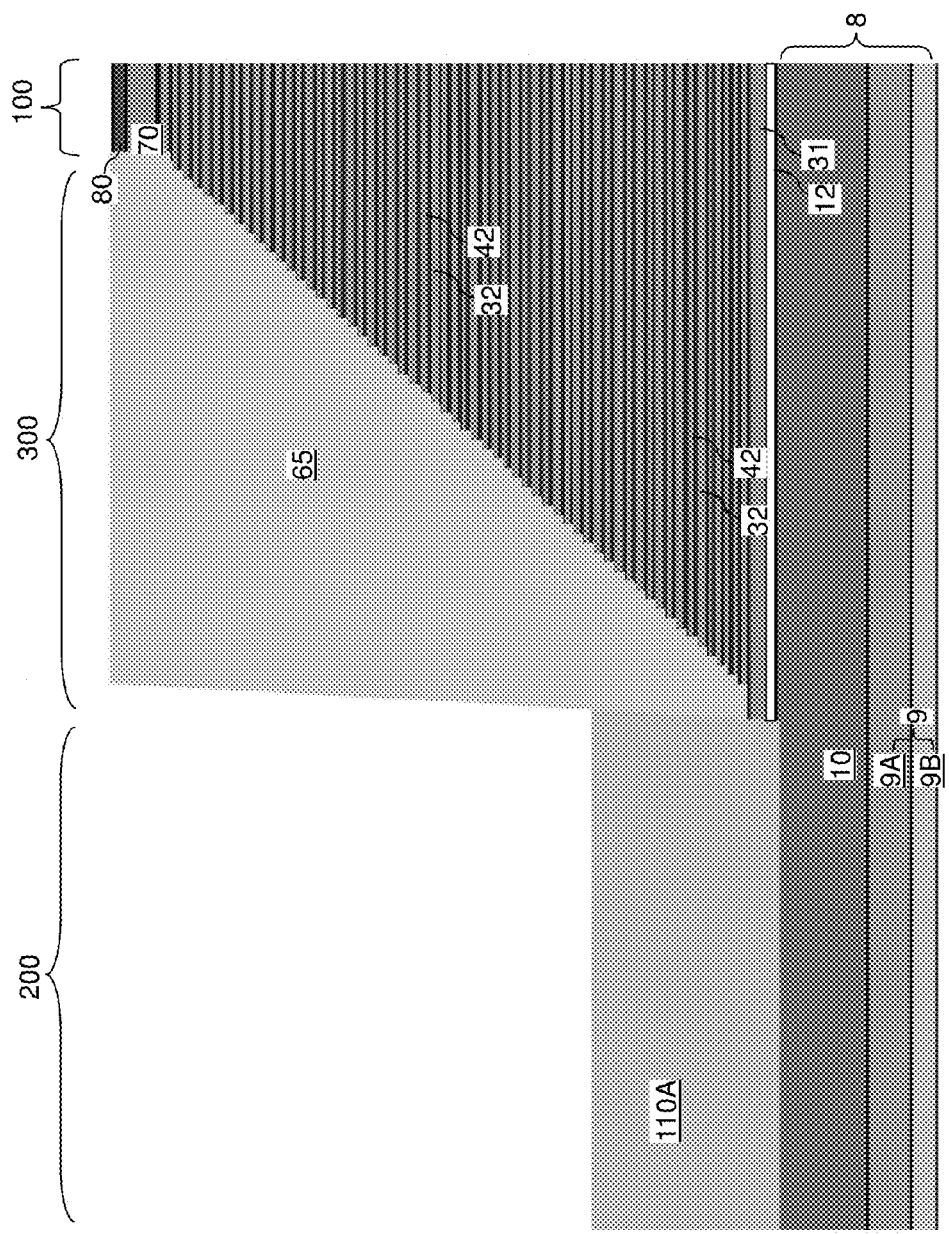
FIG. 9 is a vertical cross-sectional view of the second exemplary structure after formation of an epitaxial semiconductor portion according to the second embodiment of the present disclosure.
Figure 10A:
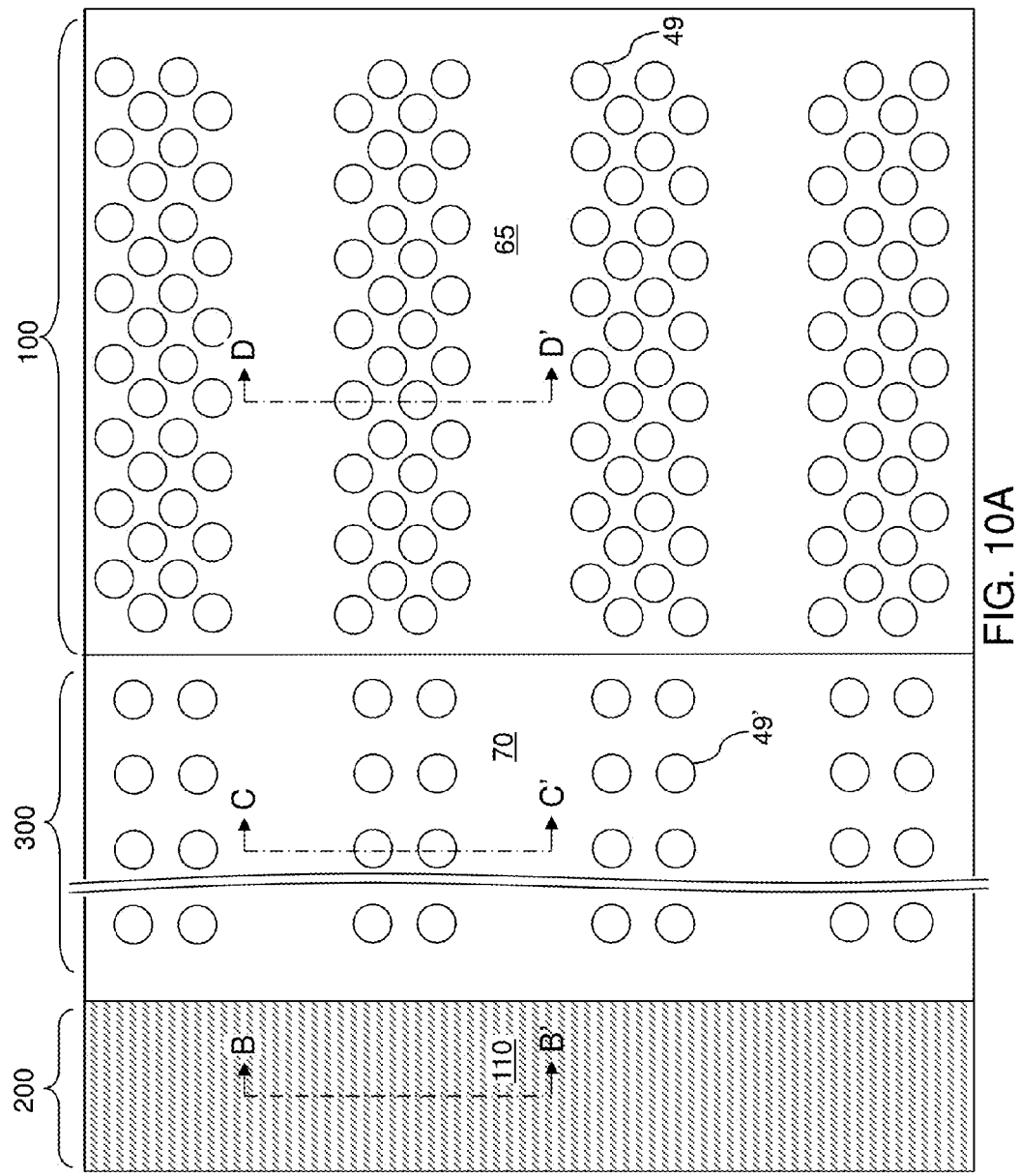
FIG. 10A is a top-down view of the first or second exemplary structure after formation of memory openings and epitaxial channel portions according to the second embodiment of the present disclosure.
Figure 11A:
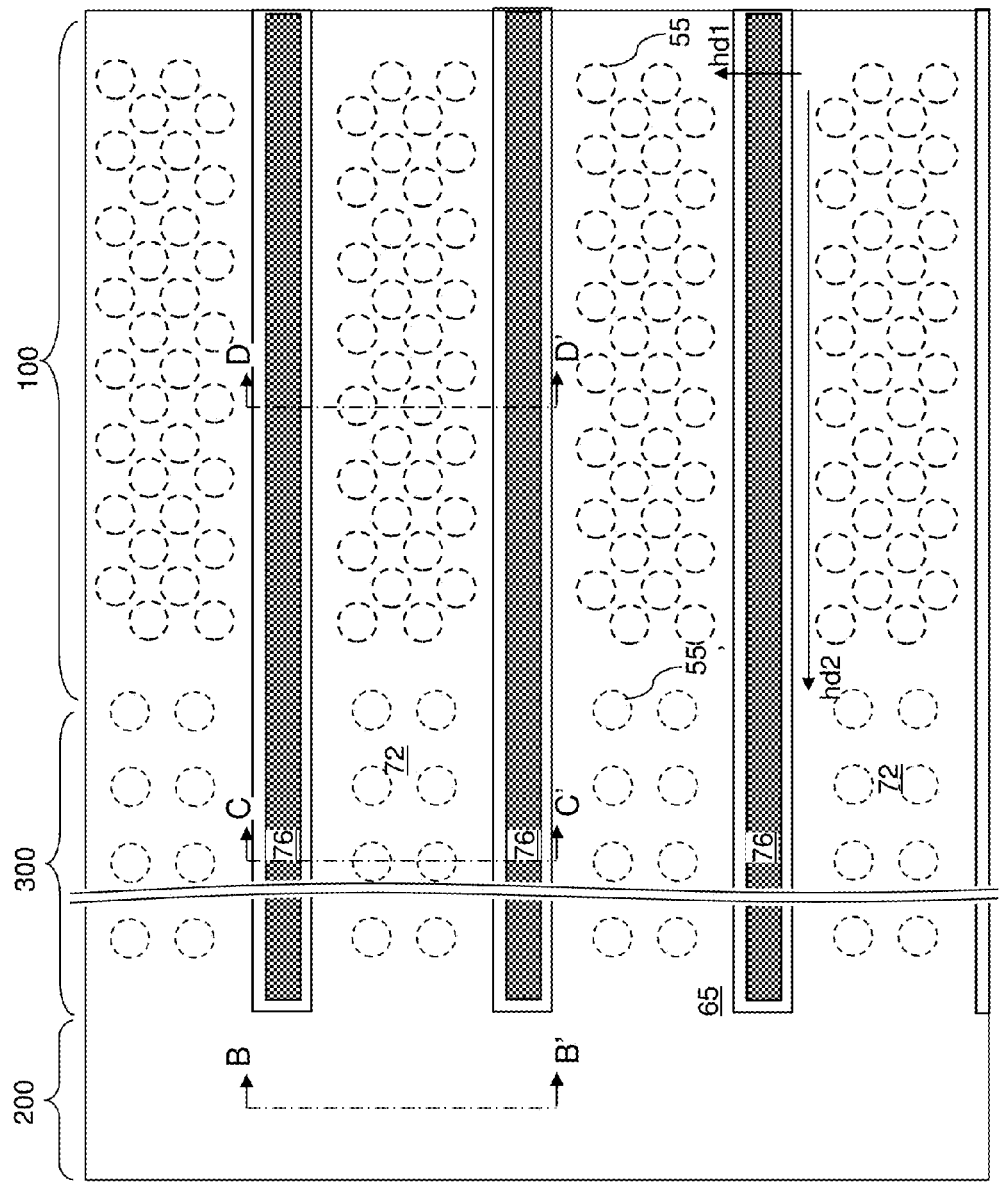
FIG. 11A is a top-down view of the first or second exemplary structure after formation of memory stack structures and backside contact structures according to the embodiments of the present disclosure.
Figure 12A:
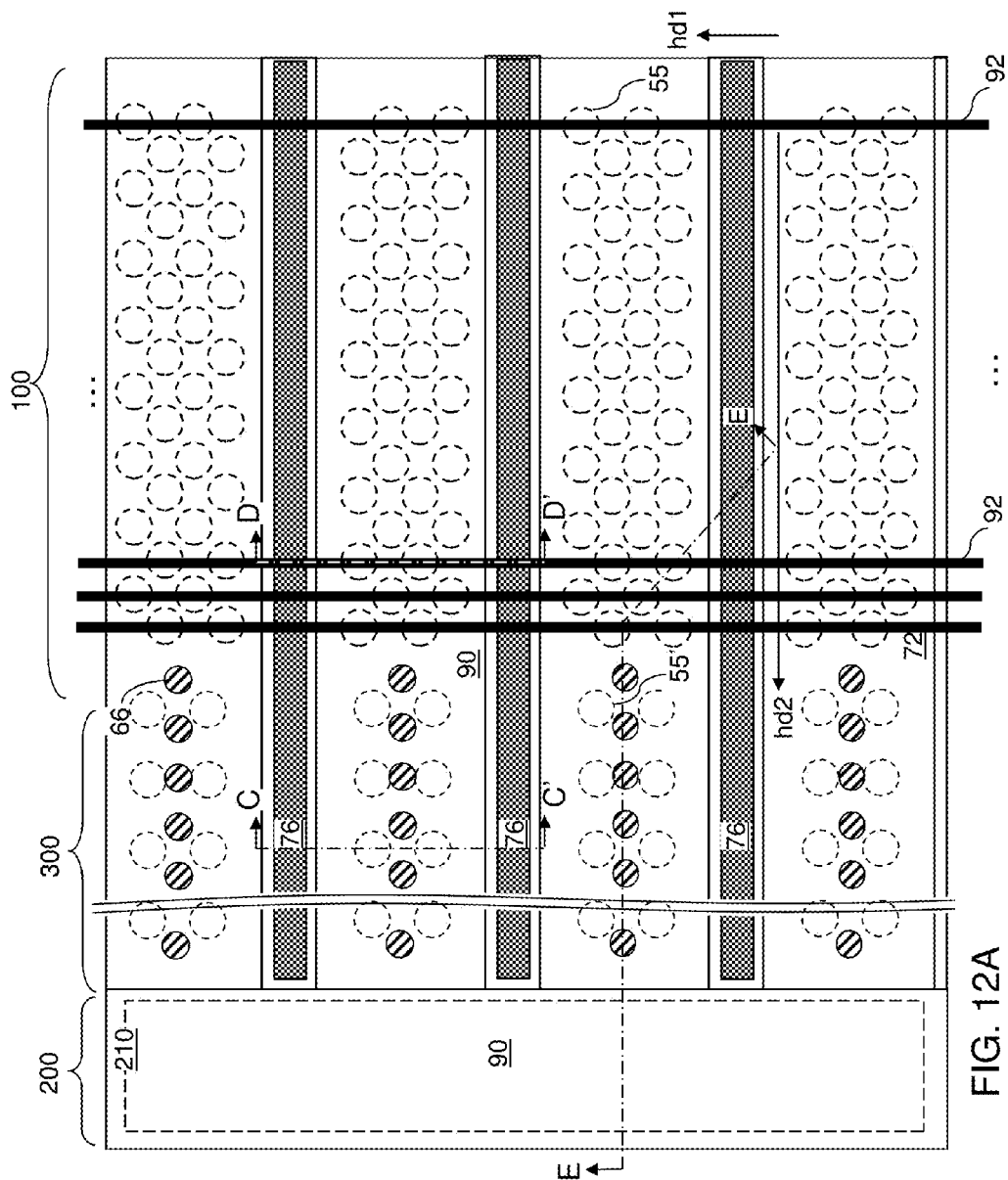
FIG. 12A is a top-down view of the first or second exemplary structure after formation of peripheral devices according to the embodiments of the present disclosure.
Figure 12E:
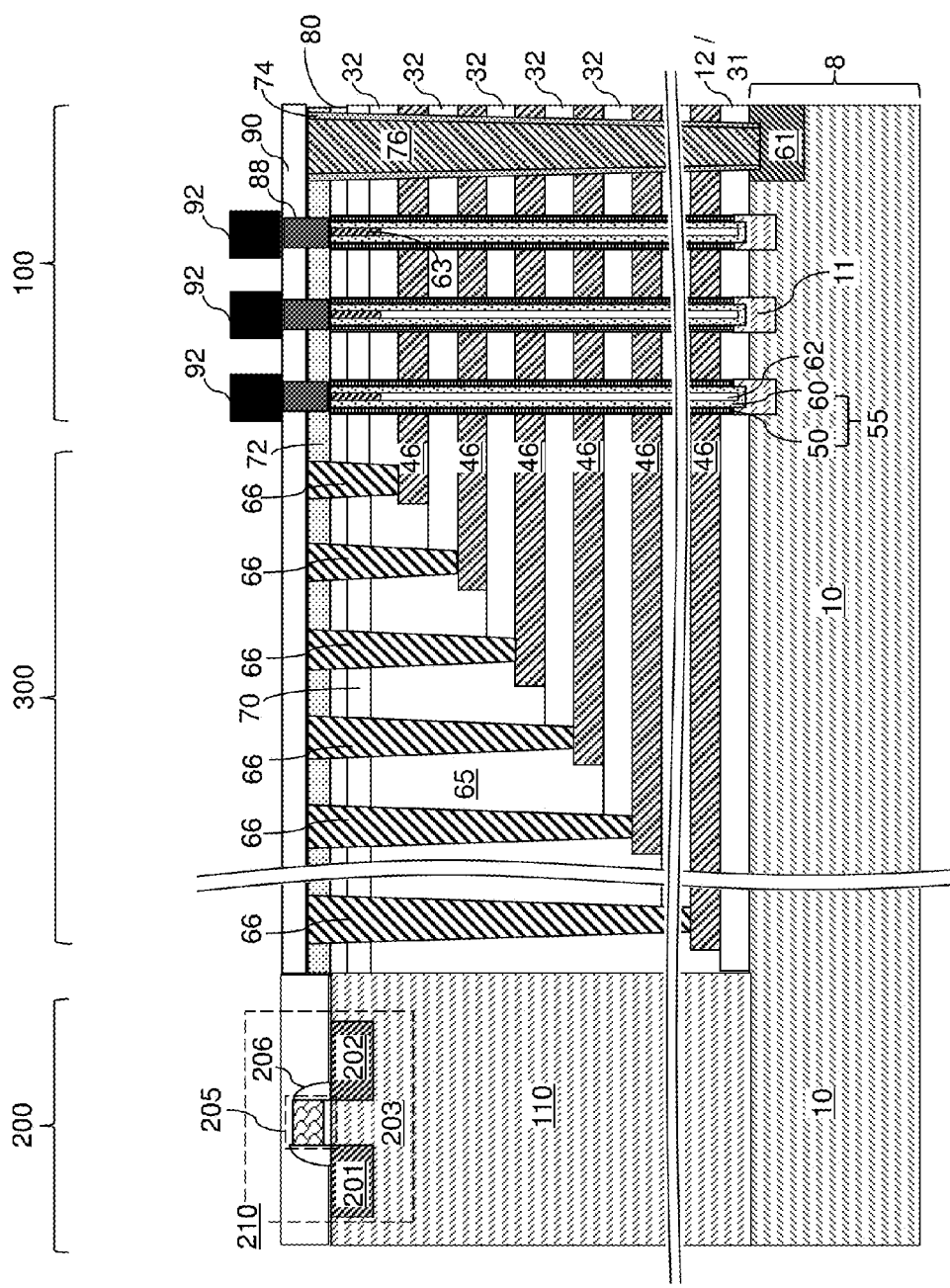
FIG. 12E is a vertical cross-sectional view of the exemplary structure of FIG. 12A along the vertical plane E-E'.

Referring to FIG. 9, a lower epitaxial semiconductor pedestal portion 110A can be formed in the peripheral device region 200, which is the region in which a top surface of the single crystalline substrate semiconductor material of the semiconductor material layer 10 is physically exposed. The lower epitaxial semiconductor pedestal portion 110A can be formed by a selective epitaxy process, which is herein referred to as a first selective epitaxy process. The lower epitaxial semiconductor pedestal portion 110A comprises a single crystalline semiconductor material in epitaxial alignment with the single crystalline substrate semiconductor material of the semiconductor material layer 10. Optionally, the lower epitaxial semiconductor pedestal portion 110A can be doped with electrical dopants of a suitable conductivity type. The top surface of the lower epitaxial semiconductor pedestal portion 110A can be located below the horizontal plane including the top surface of the planarization stopping layer 80 and below the top surface of the retro-stepped dielectric material portion 65. The sidewall surfaces of the lower epitaxial semiconductor pedestal portion 110A can contact a sidewall of the retro-stepped dielectric material portion 65, which can be a substantially vertical sidewall. The angle of the sidewalls of the lower epitaxial semiconductor pedestal portion 110A with respect to a horizontal plane can be in a range from 80 degrees to 100 degrees, such as 90 degrees, although lesser and greater angles can also be employed.

The selective epitaxy process that forms the lower epitaxial semiconductor pedestal portion 110A can be the same as the selective epitaxy process that can be employed to form the epitaxial semiconductor pedestal 110 of FIG. 3. The duration of the selective epitaxy process can be selected such that the thickness of the lower epitaxial semiconductor pedestal portion 110A can be between 30% and 99% of the vertical distance between the top surface of the planarization stopping layer 80 and the top surface of the semiconductor substrate 8.

Referring to FIGS. 10A-10D, a photoresist layer (not shown) is applied over the second exemplary structure of FIG. 9 or over the first exemplary structure of FIG. 5. The photoresist layer can be applied over planarization stopping layer 80, the retro-stepped dielectric material portion 65, and either (i) the pedestal 110 of the first exemplary structure of the first embodiment shown in FIG. 5 or (ii) the lower epitaxial semiconductor pedestal portion 110A in the second structure according to the second embodiment shown in FIG. 9. The photoresist layer is lithographically patterned to form openings therein. The pattern of the openings is selected such that a first subset of the openings is formed within the device region 100 at which formation of memory stack structures is desired, and a second subset of the openings is formed within the contact region 300 at which formation of dummy support structures is desired. As used herein, a "dummy" structure refers to a structure that is not electrically active.

Memory openings 49 and dummy memory openings 49' can be formed by transferring the pattern of the openings through the planarization stopping layer 80, the insulating cap layer 70, the alternating stack (32, 42), the bottom insulator layer 31, the dielectric pad layer 12, and the retro-stepped dielectric material portion 65. In one embodiment, each memory opening 49 may have a smaller diameter or width than each dummy memory opening 49'. Alternatively, the openings 49 may have the same diameter or width. The transfer of the pattern of the openings can be performed employing an anisotropic etch such as a reactive ion etch. At least one semiconductor surface (e.g., layer 10)

is physically exposed at a bottom portion of each memory opening 49 and each dummy memory opening 49' by the anisotropic etch. The photoresist layer can be subsequently removed, for example, by ashing.

In the method of the second embodiment, an upper epitaxial semiconductor pedestal portion 110B and epitaxial channel portions 11 can be simultaneously formed on the second exemplary structure of FIG. 9 by another selective epitaxy process, which is herein referred to as a second selective epitaxy process. The upper epitaxial semiconductor pedestal portion 110B is formed directly on the lower epitaxial semiconductor pedestal portion 110A. Each epitaxial channel portion 11 is formed directly on the physically exposed semiconductor surfaces of the semiconductor material layer 10 in the substrate 8.

In one embodiment, the second selective epitaxy process can be performed in a process region in which the supply of the reactant gas (i.e., the semiconductor precursor gas) limits the deposition rate of the semiconductor material. In this case, the upper epitaxial semiconductor pedestal portion 110B can have a greater thickness than the epitaxial channel portions 11. The combination of the lower epitaxial semiconductor pedestal portion 110A and the upper epitaxial semiconductor pedestal portion 110B constitutes an epitaxial semiconductor pedestal 110. In one embodiment, the thickness of the lower epitaxial semiconductor pedestal apportion 110A and the thickness of the upper epitaxial semiconductor pedestal portion 110B can be selected such that the top surface of the upper epitaxial semiconductor pedestal portion 110B is substantially coplanar with the top surface of the retro-stepped dielectric material portion 65 and/or the top surface of the planarization stopping layer 80. In another embodiment, the thickness of the lower epitaxial semiconductor pedestal apportion 110A and the thickness of the upper epitaxial semiconductor pedestal portion 110B can be selected such that the top surface of the upper epitaxial semiconductor pedestal portion 110B is formed above a horizontal plane including the top surface of the retro-stepped dielectric material portion 65 and the top surface of the planarization stopping layer 80. In this case, a touch-up chemical mechanical planarization process may be optionally performed after formation of memory stack structures and drain regions.

The plurality of memory openings 49 is formed through the remaining portion of the alternating stack (32, 42) after the first epitaxial semiconductor deposition process and prior to the second epitaxial semiconductor deposition process. The upper epitaxial semiconductor pedestal portion 110B comprises a single crystalline semiconductor material in epitaxial alignment with the single crystalline substrate semiconductor material of the semiconductor material layer 10. The semiconductor material of the upper epitaxial semiconductor pedestal portion 110B and the epitaxial channel portions 11 can be the same as, or can be different from, the semiconductor material of the lower epitaxial semiconductor pedestal portion 110A (e.g., both may comprise single crystal silicon). Thus, an epitaxial semiconductor pedestal 110 and a retro-stepped dielectric material portion 65 are formed over a semiconductor surface of the semiconductor substrate 8 and over the stepped surfaces, respectively. If desired, the portion 65 may also be formed over part of the substrate 8. The epitaxial semiconductor pedestal 110 is in epitaxial alignment with a single crystalline substrate semiconductor material in the semiconductor substrate 8.

In the method of the first embodiment, the epitaxial semiconductor pedestal 110 is masked during formation of the epitaxial channel portions 11 in the first exemplary structure of FIG. 5. Alternatively, the epitaxial channel portions 11 may be omitted entirely, and the channel 60 may directly contact the substrate 8 (e.g., directly contact layer 10).

Referring to FIGS. 11A-11D the next step in the methods of the first and the second embodiments include forming a memory film layer within each of the memory openings 49 and the dummy memory openings 49' by a sequential deposition of material layer. For example, at least one blocking dielectric layer, a memory material layer, and a tunneling dielectric layer can be sequentially deposited to form a contiguous layer stack. The at least one blocking dielectric layer includes at least one dielectric material such as a dielectric metal oxide material and/or silicon oxide. The memory material layer can include a charge trapping dielectric material such as silicon nitride or a plurality of conductive floating gates. The tunneling dielectric layer includes a single dielectric layer, such as silicon oxide, or a dielectric layer stack such as an ONO stack (i.e., a silicon oxide, silicon nitride, silicon oxide stack).

A first contiguous semiconductor material layer can be deposited over the memory film 50. The first contiguous semiconductor material layer can be a polycrystalline or an amorphous semiconductor material layer. An anisotropic etch can be performed to remove horizontal portions of the first contiguous semiconductor material layer and the memory film layer. Each remaining portion of the memory film layer within a memory opening 49 or within a dummy memory opening 49' constitutes a memory film 50. Each remaining portion of the first contiguous semiconductor material layer within a memory opening 49 or within a dummy memory opening 49' constitutes a first semiconductor material layer 601. An opening is formed though a stack of a first semiconductor material layer 601 and a memory film 50 at a bottom portion of each memory opening 49 and each dummy memory opening 49'. A top surface of an epitaxial channel portion 11 is physically exposed through an opening in each memory film 50. If portion 11 is omitted, then layer 10 may be exposed instead.

A second contiguous semiconductor material layer is deposited directly on the physically exposed top surfaces of the epitaxial channel portions 11. A dielectric fill material is deposited in the cavities that are unfilled portions of the memory openings 49 or the dummy memory openings 49'. The horizontal portions of the dielectric fill material and the second contiguous semiconductor material layer are removed from above the top surfaces of the retro-stepped dielectric material portion 65 and the epitaxial semiconductor pedestal 110 by a planarization process, which can include a recess etch and/or chemical mechanical planarization. Each remaining portion of the second contiguous semiconductor material layer constitutes a second semiconductor material layer 602. Each adjoining pair of a first semiconductor material layer 601 and a second semiconductor material layer 602 constitutes a vertical semiconductor channel 60. Each adjoining pair of a memory film 50 and a vertical semiconductor channel 60 in the device region 100 constitutes a memory stack structure 55 which is electrically contacted by a respective bit line, as will be described in more detail below. Each adjoining pair of a memory film 50 and a vertical semiconductor channel 60 in the contact region 300 constitutes a dummy memory stack structure 55' which is not electrically contacted by a respective bit line. The dielectric fill material is subsequently recessed below the top surface of the planarization stopping layer 80. Each remaining portion of the dielectric fill material in a memory opening 49 or in a dummy memory opening 49' constitutes a dielectric core 62. A doped semiconductor material is deposited in the recess regions to form drain regions 63. Each drain region 63 contacts a vertical semiconductor channel 60 and overlies a dielectric core 62.

A contact level dielectric layer 72 is formed over the planarization stopping layer 80, the retro-stepped dielectric material portion 65, and the epitaxial semiconductor pedestal 110. Backside contact trenches can be formed through the contact level dielectric layer 72, the planarization stopping layer 80, the insulating cap layer 70, the alternating stack (32, 42), the bottom insulator layer 31, the dielectric pad layer 12, and the retro-stepped dielectric material portion 65. In one embodiment, the memory stack structures 55 can be formed as groups that are laterally spaced from one another along a first horizontal direction hd1. In this case, the backside contact trenches can extend along a second horizontal direction hd2, which can be perpendicular to the first horizontal direction hd1. The backside contact trenches can extend into an upper portion of the semiconductor material layer 10.

Electrical dopants can be implanted into surface portions of the semiconductor material layer 10 to form source regions 61. In one embodiment, the semiconductor material layer 10 and the epitaxial channel portions 11 can have a doping of a first conductivity type (such as p-type), and the source regions 61 and the drain regions 63 can have a doping of s second conductivity type (such as n-type). The vertical semiconductor channels 60 can have a doping of the first conductivity type, or can be substantially intrinsic. As used herein, a semiconductor material is substantially intrinsic if the dopant concentration does not exceed $10 \times 10^{16}/cm^3$.

In one embodiment, the spacer material layers 42 can comprise sacrificial material layers. In this case, the sacrificial material layers 42 can be replaced with conductive material layers, for example, by removing the sacrificial material layers 42 selective to the insulator layer 32 employing a selective etch process to form lateral recesses, and by depositing at least one conductive material (such as a combination of a metallic nitride liner (e.g., TiN) and a metal fill material (e.g., W) to fill the lateral recesses. The portions of the conductive material outside of the lateral recesses (for example, in the backside contact trenches and over the contact level dielectric layer 72) can be removed by an isotropic etch. Each lateral recess is filled with an electrically conductive layer 46, which can function as control gate electrodes of the memory stack structures 55. The dummy memory stack structures 55' are used to support the spaced apart layers 32 in the stack after layers 42 are removed from the stack.

Alternatively, the spacer material layers 42 can be provided as electrically conductive layers. In this case, replacement of the spacer material layers with at least one conductive material is not necessary.

An insulating spacer 74 can be formed on sidewalls of each backside contact trench, for example, by deposition of a conformal dielectric material layer and an anisotropic etch that removes horizontal portions of the conformal dielectric material layer. Each remaining vertical portion of the conformal dielectric material layer constitutes an insulating spacer 74.

At least one conductive material can be deposited within the unfilled portions of the backside contact trenches to form a backside contact via structure 76 within each backside contact trench. In one embodiment, multiple conductive materials can be employed to form the backside contact via structures 76. In one embodiment, each backside contact via structure 76 can include a lower backside contact via portion 76A containing a first conductive material and an upper backside contact via portion 76B containing a second conductive material.

Referring to FIGS. 12A-12E, contact via structures 66 can be formed through the retro-stepped dielectric material portion 65 to a respective electrically conductive layer 46 in the methods of the first and the second embodiments. The contact via structures 66 provide electrical contact to the electrically conductive layers 46, which may be formed by replacement of sacrificial material layers (as embodied as the spacer material layers 42), or provided as the spacer material layers 42. Memory contact via structures 88 (i.e., drain electrodes/local interconnects) are formed in openings in a via level dielectric layer 90 deposited over the device such that each respective structure 88 contacts the drain region 63 in a respective memory stack structure 55. A plurality of bit lines 92 are then formed in electrical contact with the structures 88. The structures 88 and bit lines 92 do not electrically contact the dummy memory stack structures 55' in region 300.

The portion of the contact level dielectric layer 72 in the peripheral device region 200 can be removed, for example, by application and patterning of a photoresist layer to cover the device region 100 and the contact region 300, and by removing physically exposed portions of the contact level dielectric layer 72. At least one semiconductor device 210 can be formed on the epitaxial semiconductor pedestal 110. In an illustrative example, the at least one semiconductor device 210 can include at least one field effect transistor that includes a transistor source region 201, a transistor drain region 202, a transistor body region 203, a gate electrode 205 (that includes a gate dielectric and a gate conductor), and a gate spacer 206. The at least one semiconductor device 210 can be any semiconductor device known in the art.

The exemplary structure of FIGS. 12A-12E includes a multilevel structure, comprising an alternating stack {(32, 46) or (32, 42)} of electrically conductive layers (46 or 42) and insulator layers 32 located over a semiconductor substrate 8; an array of memory stack structures 55 located within memory openings through the alternating stack {(32, 46) or (32, 42)}; a retro-stepped dielectric material portion 65 overlying stepped surfaces of the alternating stack {(32, 46) or (32, 42)}; and an epitaxial semiconductor pedestal 110 in epitaxial alignment with a single crystalline substrate semiconductor material in the semiconductor substrate 8. In one embodiment, the pedestal 110 may have a top surface within a same horizontal plane as a top surface of the retro-stepped dielectric material portion 65. Preferably, the pedestal 110 has substantially vertical sidewalls and no stepped surfaces in the sidewalls.

At least one semiconductor device 210 can be located on the top surface of the epitaxial semiconductor pedestal 110. The at least one semiconductor device 210 can comprise a field effect transistor including a gate electrode 205 that protrudes above a top surface of a contact level dielectric layer 72 that overlies the memory stack structures 55. An array of drain regions 63 can contact a respective semiconductor channel 60 within the array of memory stack structures 55. A bottom surface of each drain region 63 can be located below a bottom surface of the planarization stopping layer 72.

An array of epitaxial channel portions 11 can underlie the array of memory stack structures 55. The array of epitaxial channel portions 11 can have the same material composition as an upper portion of the epitaxial semiconductor pedestal 110. In one embodiment, the epitaxial semiconductor pedestal 110 can comprise an upper epitaxial semiconductor pedestal portion 110B and a lower epitaxial semiconductor pedestal portion 110A that comprises a different semiconductor material than the upper semiconductor pedestal portion 110B.

In one embodiment, contact via structures 66 can extend through the retro-stepped dielectric material portions 65 and contact a respective electrically conductive layer (46 or 42). In one embodiment, the entire contact area between the retro-stepped dielectric material portion 65 and the epitaxial semiconductor pedestal 110 can be within a two-dimensional plane, which can be the plane of a facet of the epitaxial semiconductor pedestal 110 and/or a substantially vertical sidewall of the retro-stepped dielectric material portion 65.

In one embodiment, the multistack structure can comprise a monolithic three-dimensional NAND memory device. The semiconductor substrate can comprise a silicon substrate. The monolithic three-dimensional NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon. Each NAND string can comprise a semiconductor channels. At least one end portion the semiconductor channel can extend substantially perpendicular to a top surface of the silicon substrate. Each NAND string can comprise a plurality of charge storage elements. Each charge storage element can be located adjacent to a respective semiconductor channel. In one embodiment, each charge storage element can be a portion of the charge storage material that is located adjacent to a control gate electrode as embodied as a conductive material layer (46 or 42). Each NAND string can comprise a plurality of control gate electrodes having a strip shape extending substantially parallel to the top surface of the silicon substrate. The plurality of control gate electrodes can comprise at least a first control gate electrode located in the first device level and a second control gate electrode located in the second device level.

Generally speaking, thermal budget is a big concern for complementary metal oxide semiconductor (CMOS) devices for three-dimensional (3D) NAND device manufacturing. Preferably, memory stack structures employ high quality material layers, which can be implemented by high temperature process steps. If a CMOS module (e.g., containing peripheral/driver circuit transistors) in the peripheral region 200 is built before the memory array formation in the device region 100, then the CMOS devices are impacted by all memory array thermal processes during formation of the memory array in region 100. According to the methods of the present disclosure, an epitaxial semiconductor pedestal is grown after staircase formation and prior to formation of memory stack structures. The CMOS devices are fabricated after formation of the memory stack structures, which reduces thermal budget that the CMOS devices of the peripheral device region 200 are subjected to. The planarity of the top surface of the retro-stepped dielectric material portion 65 can be improved, and the contact via structures (not shown) that are formed above the peripheral devices can be short, thereby reducing the parasitic resistance and the parasitic capacitance of the metal interconnect structures connected to the peripheral devices of the present disclosure.

Another advantage of the embodiments is that the pedestal 100 can be used as a planarization (e.g., polish) stop during planarization (e.g., CMP) of the retro-stepped dielectric material portion 65 when the pedestal 110 is formed after the stepped surfaces in region 300. Another non-limiting advantage of forming the pedestal 110 after forming the stepped surfaces in region 300 is that no stepped surfaces are formed in the sidewall(s) of the pedestal 110. This leaves more room at the flat top surface of the pedestal 110 to form peripheral (e.g., driver circuit) devices and/or a reduction of space used for the pedestal which permits more memory devices to be formed in region 100 for the same size substrate.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A method of fabricating a memory device, comprising:
forming an alternating stack of insulator layers and spacer material layers over a single crystalline semiconductor surface of a substrate;
forming stepped surfaces by patterning the alternating stack, wherein the single crystalline semiconductor surface is exposed in a region from which all layers of the alternating stack are removed;
after forming the stepped surfaces, forming an epitaxial semiconductor pedestal and a dielectric material portion over a semiconductor surface of the semiconductor substrate and over the stepped surfaces, respectively, wherein the epitaxial semiconductor pedestal is in epitaxial alignment with the single crystalline semiconductor surface of the substrate;
forming an array of memory stack structures through a remaining portion of the alternating stack;
forming at least one semiconductor device on the epitaxial semiconductor pedestal;
forming a planarization stopping layer over the alternating stack;
patterning the planarization stopping layer prior to forming the stepped surfaces;
depositing a dielectric material over the patterned planarization stopping layer, the stepped surfaces and the epitaxial semiconductor pedestal; and
planarizing the dielectric material using the epitaxial semiconductor pedestal and the planarization stopping layer a stopping structures to form the dielectric material portion,
wherein the epitaxial semiconductor pedestal is formed by a selective epitaxy process prior to formation of the dielectric material portion.
2. The method of claim 1, wherein:
forming at least one semiconductor device on the epitaxial semiconductor pedestal comprises forming at least one transistor of a driver circuit of the memory device on the epitaxial semiconductor pedestal; and
the epitaxial semiconductor pedestal has substantially vertical sidewalls.

3. The method of claim 2, wherein the epitaxial semiconductor pedestal sidewalls lack stepped structures.

4. The method of claim 1, wherein each of the memory stack structures comprises:
- a memory film including tunneling dielectric, at least one charge storage region and a blocking dielectric; and
- a vertical semiconductor channel contacting an inner surface of the memory film and overlying the single crystalline semiconductor surface of the substrate.

5. The method of claim 1, wherein:
- the spacer material layers are provided as, or are replaced with, electrically conductive layers; and
- the method further comprises forming contact via structures through the dielectric material portion to a respective electrically conductive layer.

6. A method of fabricating a memory device, comprising:
- forming an alternating stack of insulator layers and spacer material layers over a single crystalline semiconductor surface of a substrate;
- forming stepped surfaces by patterning the alternating stack, wherein the single crystalline semiconductor surface is exposed in a region from which all layers of the alternating stack are removed;
- after forming the stepped surfaces, forming an epitaxial semiconductor pedestal and a dielectric material portion over a semiconductor surface of the semiconductor substrate and over the stepped surfaces, respectively, wherein the epitaxial semiconductor pedestal is in epitaxial alignment with the single crystalline semiconductor surface of the substrate;
- forming an array of memory stack structures through a remaining portion of the alternating stack; and
- forming at least one semiconductor device on the epitaxial semiconductor pedestal,
- wherein the dielectric material portion is formed by deposition and patterning of a dielectric material prior to formation of the epitaxial semiconductor pedestal, and
- wherein the epitaxial semiconductor pedestal is formed by:
- performing a first epitaxial semiconductor deposition process that forms a lower epitaxial semiconductor pedestal portion; and
- performing a second epitaxial semiconductor deposition process that forms an upper epitaxial semiconductor pedestal portions, wherein the lower and upper epitaxial semiconductor pedestal portions collectively constitute the epitaxial semiconductor pedestal.

7. The method of claim 6, further comprising:
- forming a plurality of memory openings through the remaining portion of the alternating stack after the first epitaxial semiconductor deposition process and prior to the second epitaxial semiconductor deposition process; and
- forming an array of epitaxial channel portions in the plurality of memory openings during the second epitaxial semiconductor deposition process that forms the upper epitaxial semiconductor pedestal portions.

8. The method of claim 7, wherein forming the array of memory stack structures comprises forming the array of memory stack structures in the respective memory openings on the an array of epitaxial channel portions.

9. A method of fabricating a memory device, comprising:
- forming an alternating stack of insulator layers and spacer material layers over a single crystalline semiconductor surface of a substrate;
- forming a planarization stopping layer over the alternating stack;
- forming stepped surfaces by patterning the alternating stack, wherein the single crystalline semiconductor surface is exposed in a region from which all layers of the alternating stack are removed;
- after forming the stepped surfaces, forming an epitaxial semiconductor pedestal and a dielectric material portion over a semiconductor surface of the semiconductor substrate and over the stepped surfaces, respectively, wherein the epitaxial semiconductor pedestal is in epitaxial alignment with the single crystalline semiconductor surface of the substrate;
- planarizing a topmost surface of the epitaxial semiconductor pedestal employing the planarization stopping layer as a stopping layer;
- forming an array of memory stack structures through a remaining portion of the alternating stack; and
- forming at least one semiconductor device on the epitaxial semiconductor pedestal.

10. A method of fabricating a memory device, comprising:
- forming an alternating stack of insulator layers and spacer material layers over a single crystalline semiconductor surface of a substrate;
- forming steeped surfaces by patterning the alternating stack, wherein the single crystalline semiconductor surface is exposed in a region from which all layers of the alternating stack are removed;
- after forming the stepped surfaces, forming an epitaxial semiconductor pedestal and a dielectric material portion over a semiconductor surface of the semiconductor substrate and over the stepped surfaces, respectively, wherein the epitaxial semiconductor pedestal is in epitaxial alignment with the single crystalline semiconductor surface of the substrate;
- forming an array of memory stack structures through a remaining portion of the alternating stack; and
- forming at least one semiconductor device on the epitaxial semiconductor pedestal;
- forming a plurality of dummy openings through the stepped surfaces;
- forming a plurality of dummy memory stack structures in the plurality of dummy openings at the same time as forming the array of memory stack structures; and
- forming a plurality of bit lines in electrical contact with the array of memory stack structures, such that the plurality of dummy memory stack structures are not in electrical contact with the plurality of bit lines,
- wherein each of the memory stack structures comprises:
- a memory film including tunneling dielectric, at least one charge storage region and a blocking dielectric; and
- a vertical semiconductor channel contacting an inner surface of the memory film and overlying the single crystalline semiconductor surface of the substrate.

11. The method of claim 10, further comprising:
- removing the spacer material layers to form a plurality of recesses using the plurality of dummy memory stack structures as support pillars; and
- forming conductive material layers which comprise control gate electrodes of the memory device in the plurality of recesses.

12. A method of fabricating a memory device, comprising:
- forming an alternating stack of insulator layers and spacer material layers over a single crystalline semiconductor surface of a substrate;

forming stepped surfaces by patterning the alternating stack, wherein the single crystalline semiconductor surface is exposed in a region from which all layers of the alternating stack are removed;

after forming the stepped surfaces, forming an epitaxial semiconductor pedestal and a dielectric material portion over a semiconductor surface of the semiconductor substrate and over the stepped surfaces, respectively, wherein the epitaxial semiconductor pedestal is in epitaxial alignment with the single crystalline semiconductor surface of the substrate;

forming an array of memory stack structures through a remaining portion of the alternating stack; and forming at least one semiconductor device on the epitaxial semiconductor pedestal, wherein:

the memory device comprises a monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in the first device level of the three-dimensional array of NAND strings is located over another memory cell in the second device level of the three dimensional array of NAND strings;

the silicon substrate contains an integrated circuit comprising a driver circuit for the memory device located thereon; and each NAND string comprises:

a semiconductor channels, wherein at least one end portion the semiconductor channel extends substantially perpendicular to a top surface of the silicon substrate;

a plurality of charge storage elements, each charge storage element located adjacent to a respective semiconductor channel; and a plurality of control gate electrodes having a strip shape extending substantially parallel to the top surface of the semiconductor substrate, the plurality of control gate electrodes comprise at least a first control gate electrode located in the first device level and a second control gate electrode located in the second device level.

13. A memory device, comprising:

an alternating stack of electrically conductive layers and insulator layers located over a semiconductor substrate;

an array of memory stack structures located within memory openings which extend through the alternating stack;

a dielectric material portion overlying stepped surfaces of the alternating stack;

an epitaxial semiconductor pedestal having substantially vertical sidewalls in epitaxial alignment with a single crystalline substrate semiconductor material in the semiconductor substrate; and at least one semiconductor device located on the top surface of the epitaxial semiconductor pedestal; wherein:

the epitaxial semiconductor pedestal has top surface within a same horizontal plane as a top surface of the dielectric material portion;

an entire contact area between the dielectric material portion and the epitaxial semiconductor pedestal is within a same vertical plane;

the substantially vertical sidewalls of the epitaxial semiconductor pedestal lack stepped surfaces; and the at least one semiconductor device comprises field effect transistor of a driver circuit of the memory device located in a peripheral region of the memory device.

14. The memory device of claim 13, further comprising:

an array of drain regions contacting a respective semiconductor channel within the array of memory stack structures; and a planarization stopping layer located over the alternating stack, wherein a top surface of the planarization stopping layer is coplanar with the top surface of the dielectric material portion.

15. The memory device of claim 13, further comprising an array of epitaxial channel portions underlying the array of memory stack structures and having a same material composition as at least an upper portion of the epitaxial semiconductor pedestal.

16. A memory device, comprising:

an alternating stack of electrically conductive layers and insulator layers located over a semiconductor substrate;

an array of memory stack structures located within memory openings which extend through the alternating stack;

a dielectric material portion overlying stepped surfaces of the alternating stack;

an epitaxial semiconductor pedestal having substantially vertical sidewalls in epitaxial alignment with a single crystalline substrate semiconductor material in the semiconductor substrate; and at least one semiconductor device located on the top surface of the epitaxial semiconductor pedestal, wherein the epitaxial semiconductor pedestal comprises an upper epitaxial semiconductor pedestal portion and a lower epitaxial semiconductor pedestal portion that comprises a different semiconductor material than the upper semiconductor pedestal portion.

17. A memory device, comprising:

an alternating stack of electrically conductive layers and insulator layers located over a semiconductor substrate;

an array of memory stack structures located within memory openings which extend through the alternating stack;

a dielectric material portion overlying stepped surfaces of the alternating stack;

an epitaxial semiconductor pedestal having substantially vertical sidewalls in epitaxial alignment with a single crystalline substrate semiconductor material in the semiconductor substrate;

at least one semiconductor device located on the top surface of the epitaxial semiconductor pedestal;

contact via structures extending through the dielectric material portions and contacting a respective electrically conductive layer;

a plurality of dummy openings extending through the stepped surfaces;

a plurality of dummy memory stack structures located in the plurality of dummy openings; and a plurality of bit lines in electrical contact with the array of memory stack structures, wherein the plurality of dummy memory stack structures are not in electrical contact with the plurality of bit lines.

18. A memory device, comprising:

an alternating stack of electrically conductive layers and insulator layers located over a semiconductor substrate;

an array of memory stack structures located within memory openings which extend through the alternating stack;

a dielectric material portion overlying stepped surfaces of the alternating stack;

an epitaxial semiconductor pedestal having substantially vertical sidewalls in epitaxial alignment with a single crystalline substrate semiconductor material in the semiconductor substrate:

at least one semiconductor device located on the top surface of the epitaxial semiconductor pedestal the memory device comprises a monolithic three-dimensional NAND memory device;

the semiconductor substrate comprises a silicon substrate;

the monolithic three-dimensional NAND memory device comprises an array of monolithic three-dimensional NAND strings over the silicon substrate;

at least one memory cell in the first device level of the three-dimensional array of NAND strings is located over another memory cell in the second device level of the three dimensional array of NAND strings;

the silicon substrate contains an integrated circuit comprising a driver circuit for the memory device located thereon; and each NAND string comprises:

a semiconductor channels, wherein at least one end portion the semiconductor channel extends substantially perpendicular to a top surface of the silicon substrate;

a plurality of charge storage elements, each charge storage element located adjacent to a respective semiconductor channel; and a plurality of control gate electrodes having a strip shape extending substantially parallel to the top surface of the semiconductor substrate, the plurality of control gate electrodes comprise at least a first control gate electrode located in the first device level and a second control gate electrode located in the second device level.

* * * * *